United States Patent
Jin et al.

(10) Patent No.: US 10,769,060 B2
(45) Date of Patent: Sep. 8, 2020

(54) STORAGE SYSTEM AND METHOD OF OPERATING THE SAME

(71) Applicant: SK hynix Inc., Gyeonggi-do (KR)

(72) Inventors: Yong Jin, Seoul (KR); Duck Hoi Koo, Gyeonggi-do (KR); Seung Geol Baek, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 107 days.

(21) Appl. No.: 16/032,592

(22) Filed: Jul. 11, 2018

(65) Prior Publication Data
US 2019/0179742 A1    Jun. 13, 2019

(30) Foreign Application Priority Data

Dec. 7, 2017    (KR) .................. 10-2017-0167583

(51) Int. Cl.
*G06F 12/02*    (2006.01)
*G06F 12/06*    (2006.01)
*G06F 3/06*    (2006.01)
*G11C 11/408*    (2006.01)
*G11C 16/08*    (2006.01)

(52) U.S. Cl.
CPC ........ *G06F 12/0246* (2013.01); *G06F 3/0604* (2013.01); *G06F 12/0292* (2013.01); *G06F 12/0646* (2013.01); *G11C 11/4082* (2013.01); *G11C 16/08* (2013.01)

(58) Field of Classification Search
None
See application file for complete search history.

(56) References Cited

U.S. PATENT DOCUMENTS

| | | | |
|---|---|---|---|
| 8,966,205 B1* | 2/2015 | Lo ........................ | G06F 12/0246 711/165 |
| 2006/0143365 A1* | 6/2006 | Kikuchi ................ | G06F 3/0614 711/103 |
| 2008/0244290 A1* | 10/2008 | Yoshida ................ | G06F 1/3221 713/320 |
| 2012/0265925 A1* | 10/2012 | Miura ................ | G06F 12/0246 711/103 |
| 2015/0177984 A1* | 6/2015 | Idei ........................ | G06F 3/061 711/114 |
| 2015/0186259 A1* | 7/2015 | Thomas .............. | G06F 12/0246 711/103 |
| 2017/0192902 A1* | 7/2017 | Hwang .............. | G06F 12/0246 |

(Continued)

FOREIGN PATENT DOCUMENTS

KR    1020170001235    1/2017

*Primary Examiner* — William E. Baughman
(74) *Attorney, Agent, or Firm* — IP & T Group LLP

(57) ABSTRACT

Provided herein may be a storage system and a method of operating the same. The method of operating the storage system may include outputting, by a host system, a command for reading address mapping data, pieces of which correspond to first to (n−1)-th memory systems, the address mapping data being stored in an n-th memory system, where n is a natural number of 3 or more, outputting, in a first transmission operation, the address mapping data from the n-th memory system and inputting the address mapping data to the host system in response to the command, and outputting, in a second transmission operation, the address mapping data from the host system and inputting the address mapping data to the first to (n−1)-th memory systems.

20 Claims, 15 Drawing Sheets

(56) References Cited

U.S. PATENT DOCUMENTS

2018/0024919 A1* 1/2018 Geml .................... G06F 3/061
                                                        711/103
2018/0107592 A1* 4/2018 Hashimoto .......... G06F 3/0619
2019/0121540 A1* 4/2019 Shin .................... G06F 3/0626

* cited by examiner

STORAGE SYSTEM AND METHOD OF OPERATING THE SAME

CROSS-REFERENCE TO RELATED APPLICATION

The present application claims priority under 35 U.S.C. § 119(a) to Korean patent application number 10-2017-0167583, filed on Dec. 7, 2017, which is incorporated herein by reference in its entirety.

BACKGROUND

1. Field of Invention

Various embodiments of the present disclosure generally relate to a storage system and a method of operating the storage system. Particularly, the embodiments relate to a storage system, which includes a separate meta Solid State Drives (SSDs) for storing address mapping data of a plurality of user SSDs, and to a method of operating the storage system.

2. Description of the Related Art

A memory device may include a plurality of memory blocks. Further, each memory block may include a plurality of memory cells, and an erase operation may be simultaneously performed on memory cells in a single memory block.

When a write command and a logical address are received from a host, a memory system may allocate a physical address corresponding to the logical address, and may write data to a memory area corresponding to the physical address.

A storage system may include a host system and a flash array. The host system may include a host buffer memory and a host controller. Further, the flash array may include a plurality of SSDs. Each of SSDs may include a nonvolatile memory device, a buffer memory device, and a memory controller.

SUMMARY

Various embodiments are directed to a storage system, which includes a separate meta SSD for storing metadata and which efficiently manages metadata using the separate meta SSD, and to a method of operating the storage system.

An embodiment of the present disclosure may provide for a method of operating a storage system. The method may include outputting, by a host system, a command for reading address mapping data, pieces of which correspond to first to (n−1)-th memory systems, the address mapping data being stored in an n-th memory system, where n is a natural number of 3 or more, outputting, in a first transmission operation, the address mapping data from the n-th memory system and inputting the address mapping data to the host system in response to the command, and outputting, in a second transmission operation, the address mapping data from the host system and inputting the address mapping data to the first to (n−1)-th memory systems.

An embodiment of the present disclosure may provide for a method of operating a storage system. The method may include reading, by a host system, first address mapping data from a first user Solid State Drive (SSD) when a flush condition for the first address mapping data corresponding to the first user SSD is satisfied in the first user SSD, outputting, by the host system, the first address mapping data read from the first user SSD to a meta SSD, and flushing, by the meta SSD, the first address mapping data output from the host system to the nonvolatile memory device.

An embodiment of the present disclosure may provide for a storage system. The storage system may include a flash array including first to n-th user Solid State Drives (SSDs) and a first meta SSD, where n is a natural number of 2 or more, and a host system coupled to the flash array. Here, each of the first to n-th user SSDs and the first meta SSD may include a controller buffer memory and a nonvolatile memory device. The nonvolatile memory device of the first meta SSD may be configured to store first to n-th pieces of address mapping data respectively corresponding to the first to n-th user SSDs. The host system may be configured to read the first to n-th pieces of address mapping data stored in the nonvolatile memory device of the first meta SSD during a boot operation, and store the read first to n-th pieces of address mapping data in the respective controller buffer memories of the first to n-th user SSDs.

An embodiment of the present disclosure may provide for a storage system. The storage system may include a plurality of data memory systems, each configured to buffer address mapping data in a corresponding controller buffer memory and update the address mapping data thereof according to an operation thereof, at least one dedicated meta memory system configured to store the respective address mapping data, and a host system. The host system may be configured to control, during booting of the respective data memory systems, the respective data memory systems to buffer the respective address mapping data by providing the respective address mapping data stored in the dedicated meta memory system to the respective data memory systems, and control the dedicated meta memory system to update the respective address mapping data stored therein based on the respective address mapping data buffered in the respective data memory systems by transferring the respective address mapping data buffered in the respective data memory systems to the dedicated meta memory system.

DETAILED DESCRIPTION

Advantages and features of the present disclosure, and methods for achieving the same will become clear from the following description of the embodiments together with the accompanying drawings. However, the present disclosure is not limited to the following embodiments but may be embodied in other forms. The following embodiments are provided so that the present disclosure is thorough and complete and fully conveys the technical spirit of the disclosure to those skilled in the art. Throughout the specification, reference to "an embodiment" or the like is not necessarily to only one embodiment, and different references to "an embodiment" or the like are not necessarily to the same embodiment(s).

It is also noted that in this specification, "connected/coupled" refers to one component not only directly coupling another component but also indirectly coupling another component through one or more intermediate components. In the specification, when an element is referred to as "comprising" or "including" a component, it does not preclude one or more other components but may further include such other component(s) unless the context clearly indicates otherwise.

Figure 1:
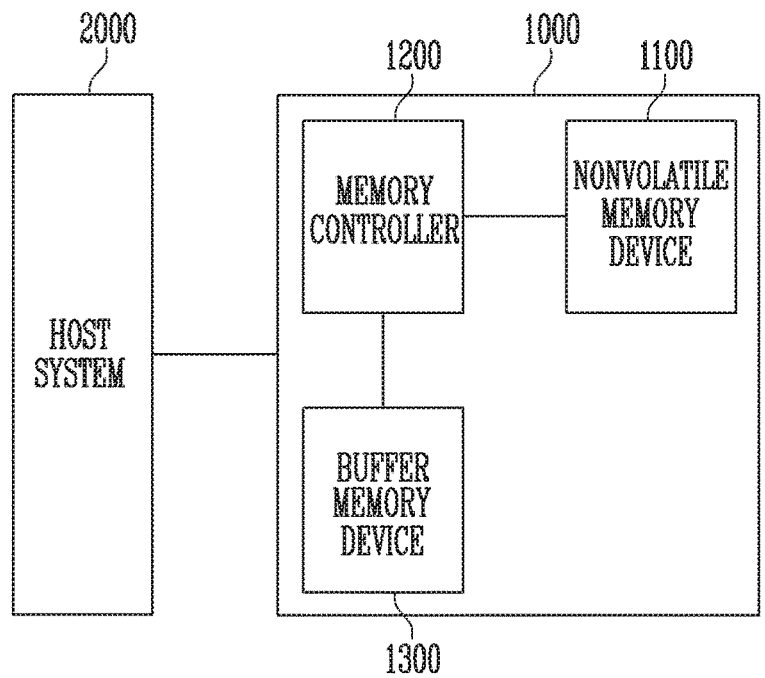
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may include a nonvolatile memory device 1100 in which data stored therein is retained even if the supply of power is interrupted, a buffer memory device 1300 which temporarily stores data, and a memory controller 1200 which controls the nonvolatile memory device 1100 and the buffer memory device 1300 under the control of a host system 2000.

The host system 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods. Further, the memory system 1000 may be a Solid State Drive (SSD) including a flash memory.

The memory controller 1200 may control the overall operation of the memory system 1000, and may control data exchange between the host system 2000 and the nonvolatile memory device 1100. For example, the memory controller 1200 may program or read data by controlling the nonvolatile memory device 1100 in response to a request received from the host system 2000. Further, the memory controller 1200 may store information about main memory blocks and sub-memory blocks in the nonvolatile memory device 1100, and may select the nonvolatile memory device 1100 so that a program operation is performed on a main memory block or a sub-memory block depending on the amount of data loaded for the program operation. In an embodiment, the nonvolatile memory device 1100 may include a flash memory.

The memory controller 1200 may control data exchange between the host system 2000 and the buffer memory device 1300 or may temporarily store system data for controlling the nonvolatile memory device 1100 in the buffer memory device 1300. The buffer memory device 1300 may be used as a working memory, a cache memory, or a buffer memory of the memory controller 1200. The buffer memory device 1300 may store codes and commands that are executed by the memory controller 1200. Further, the buffer memory device 1300 may store data that is processed by the memory controller 1200.

The memory controller 1200 may temporarily store data, received from the host system 2000, in the buffer memory device 1300, and then transmit the data, temporarily stored in the buffer memory device 1300, to the nonvolatile memory device 1100, after which the transmitted data is stored in the nonvolatile memory device 1100. Also, the memory controller 1200 may receive data and a logical address from the host system 2000, and may translate the logical address into a physical address indicating the area of the nonvolatile memory device 1100 in which the data is to be actually stored. Further, the memory controller 1200 may store a logical-physical address mapping table, which configures mapping relationships between logical addresses and physical addresses, in the buffer memory device 1300.

In an embodiment, the buffer memory device 1300 may include a double data rate synchronous dynamic random access memory (DDR SDRAM), a double data rate fourth generation (DDR4) SDRAM, a low power double data rate fourth generation (LPDDR4) SDRAM, a graphics double data rate (GDDR) SDRAM, a low power DDR (LPDDR) SDRAM, or a Rambus DRAM (RDRAM).

In an embodiment, the memory system 1000 may not include the buffer memory device 1300, which may be a separate component or its functions distributed among one or more other components of the memory system 1000.

Figure 2:
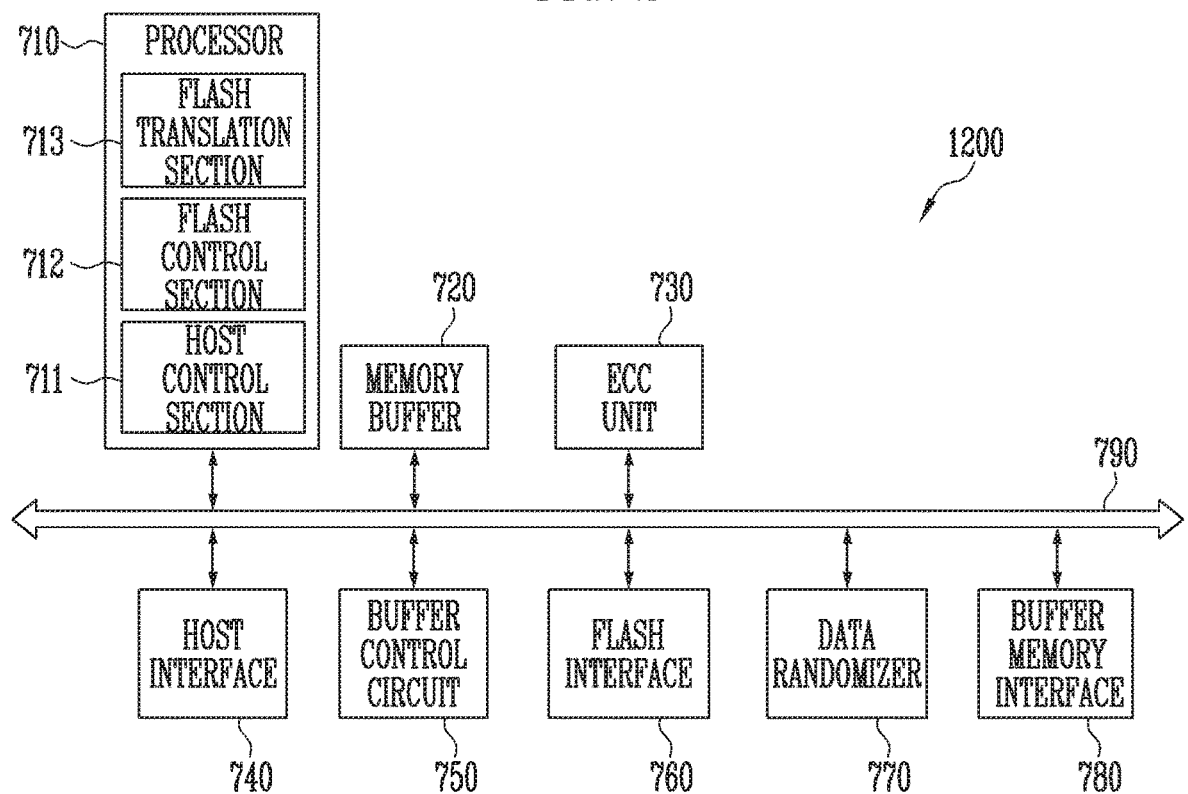
FIG. 2 is a diagram illustrating a memory controller of FIG. 1.

FIG. 2 is a diagram illustrating the memory controller of FIG. 1.

Referring to FIG. 2, the memory controller 1200 may include a processor 710, a memory buffer 720, an error checking and correction (ECC) unit 730, a host interface 740, a buffer control circuit 750, a flash interface 760, a data randomizer 770, a buffer memory interface 780, and a bus 790.

The bus 790 may provide a channel between components of the memory controller 1200.

The processor 710 may control the overall operation of the memory controller 1200 and perform a logical operation. The processor 710 may communicate with an external host system 2000 through the host interface 740, and may communicate with a nonvolatile memory device 1100 through the flash interface 760. Further, the processor 710 may communicate with a buffer memory device 1300 through the buffer memory interface 780. Furthermore, the processor 710 may control the memory buffer 720 through the buffer control circuit 750. The processor 710 may control the operation of the memory system 1000 by using the memory buffer 720 as a working memory, a cache memory or a buffer memory.

The processor 710 may queue a plurality of commands inputted from the host system 2000. This operation is called a multi-queue operation. The processor 710 may sequentially transfer a plurality of queued commands to the nonvolatile memory device 1100.

The memory buffer 720 may be used as a working memory, a cache memory, or a buffer memory of the processor 710. The memory buffer 720 may store codes and commands that are executed by the processor 710. The memory buffer 720 may store data that is processed by the processor 710. The memory buffer 720 may include a static RAM (SRAM) or a dynamic RAM (DRAM).

The ECC unit 730 may perform error checking and correction. The ECC unit 730 may perform Error Correction Code (ECC) encoding based on data to be written to the nonvolatile memory device 1100 through the flash interface 760. The ECC-encoded data may be transferred to the nonvolatile memory device 1100 through the flash interface 760. The ECC unit 730 may perform ECC decoding on data received from the nonvolatile memory device 1100 through the flash interface 760. In an embodiment, the ECC unit 730 may be included as a component of, or embodied in, the flash interface 760.

The host interface 740 may communicate with the external host system 2000 under the control of the processor 710. The host interface 740 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-Volatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 750 may control the memory buffer 720 under the control of the processor 710.

The flash interface 760 may communicate with the nonvolatile memory device 1100 under the control of the processor 710. The flash interface 760 may transmit/receive commands, addresses, and data to/from the nonvolatile memory device 1100 through a channel.

In an embodiment, the memory controller 1200 may not include the memory buffer 720 and the buffer control circuit 750.

In an embodiment, the processor 710 may control the operation of the memory controller 1200 using codes. The processor 710 may load codes from a nonvolatile memory device (e.g., ROM) provided in the memory controller 1200. In an embodiment, the processor 710 may load codes from the nonvolatile memory device 1100 through the flash interface 760.

The data randomizer 770 may randomize data or derandomize the randomized data. The data randomizer 770 may perform a data randomize operation on data to be written to the nonvolatile memory device 1100 through the flash interface 760. The randomized data may be transferred to the nonvolatile memory device 1100 through the flash interface 760. The data randomizer 770 may perform a data derandomize operation on data received from the nonvolatile memory device 1100 through the flash interface 760. In an embodiment, the data randomizer 770 may be included as a component of, or embodied in, the flash interface 760.

In an embodiment, the bus 790 of the memory controller 1200 may be divided into a control bus and a data bus. The data bus may transmit data in the memory controller 1200, and the control bus may transmit control information such as commands or addresses in the memory controller 1200. The data bus and the control bus may be separated from each other, so that neither interferes with nor influences the other. The data bus may be coupled to the host interface 740, the buffer control circuit 750, the ECC unit 730, the flash interface 760, and the buffer memory interface 780. The control bus may be coupled to the host interface 740, the processor 710, the buffer control circuit 750, the flash interface 760, and the buffer memory interface 780. In an embodiment, the memory controller 1200 may not include the buffer memory interface 780, which may be provided as a separate component or its functions distributed among one or more other components of the memory controller 1200.

The buffer memory interface 780 may communicate with the buffer memory device 1300 under the control of the processor 710. The buffer memory interface 780 may transmit/receive commands, addresses, and data to/from the buffer memory device 1300 through a channel.

The memory system 1000 may receive a write command, write data, and a logical address from the host system 2000. The memory controller 1200 may allocate a physical storage space of the nonvolatile memory device 1100 in which the write data is to be stored, that is, a memory block or a page, in response to the write command. In other words, the memory controller 1200 may map a physical address, corresponding to the logical address, to the logical address in response to the write command. Here, the physical address may be referred to as a "flash physical address" so that it is distinguished from a host physical address, and may be an address corresponding to the physical storage space of the nonvolatile memory device 1100 in which the write data received from the host system 2000 is to be stored.

The memory system 1000 may store the above-described mapping data between the logical address and the physical address, that is, logical-physical address mapping data, in the memory block of the nonvolatile memory device 1100.

When the memory system 1000 boots, the logical-physical address mapping data stored in the nonvolatile memory device 1100 may be loaded into the buffer memory device 1300 or the memory buffer 720. Furthermore, when checking of the logical-physical address mapping data stored in the nonvolatile memory device 1100 is required, the memory system 1000 may read the logical-physical address mapping data from the nonvolatile memory device 1100 and store the logical-physical address mapping data in the buffer memory device 1300 or the memory buffer 720. The buffer memory device 1300 and/or the memory buffer 720 may be referred to as a controller buffer memory.

In an embodiment, the memory system 1000 may be configured such that, when a write command, write data, and a logical address are received from the host system 2000, the memory controller 1200 allocates a physical storage space of the nonvolatile memory device 1100 in which the write data is to be stored in response to the write command. That is, the memory controller 1200 may map a physical address, corresponding to the logical address, to the logical address in response to the write command. At this time, the memory controller 1200 may update newly generated mapping data between the logical address and the physical address, that is, logical-physical address mapping data, in the buffer memory device 1300 or the memory buffer 720.

The memory system 1000 may receive a read command and a logical address from the host system 2000. In response to the read command, the memory system 1000 may check a physical address corresponding to the logical address from the logical-physical address mapping data stored in the nonvolatile memory device 1100, may read data stored in a memory area corresponding to the physical address, and may output the read data to the host system 2000.

The processor 710 may include a host control section 711, a flash control section 712, and a flash translation section 713.

The host control section 711 may control data transmission between the host system 2000, the host interface 740, and the controller buffer memory. In an example, the host control section 711 may control the operation of buffering data inputted from the host system 2000 in the memory buffer 720 or the buffer memory device 1300 via the host interface 740. In an example, the host control section 711 may control the operation of outputting the data, buffered in the memory buffer 720 or the buffer memory device 1300, to the host system 2000 via the host interface 740.

In an example, the host control section 711 may control the operation of fetching data, stored in the host buffer memory (e.g., 2100 of FIG. 6) of the host system 2000, and buffering the fetched data in the controller buffer memory, in response to the write command. Further, the host control section 711 may control the operation of outputting the data, buffered in the controller buffer memory in response to the write command, to the host buffer memory (e.g., 2100 of FIG. 6) of the host system 2000.

The flash control section 712 may control the operation of transmitting the data, buffered in the memory buffer 720 or the buffer memory device 1300, to the nonvolatile memory device 1100 and programming the data to the nonvolatile memory device 1100 during a write operation. In an example, the flash control section 712 may control the operation of buffering data, which is read and outputted from the nonvolatile memory device 1100 during a read operation, in the memory buffer 720 or the buffer memory device 1300.

The flash translation section 713 may map a physical address, corresponding to a logical address inputted from the host system 2000, to the logical address during a data write operation. Here, the data may be written to the storage space of the nonvolatile memory device 1100 corresponding to the mapped physical address. The flash translation section 713 may check the physical address mapped to the logical address inputted from the host system 2000 and transmit the physical address to the flash control section 712 during a data read operation. The flash control section 712 may read data from the storage space of the nonvolatile memory device 1100 corresponding to the physical address. The physical address, indicating the storage space of the nonvolatile memory device 1100, may be referred to as a "flash physical address" so that it is distinguished from a host physical address.

Figure 3:
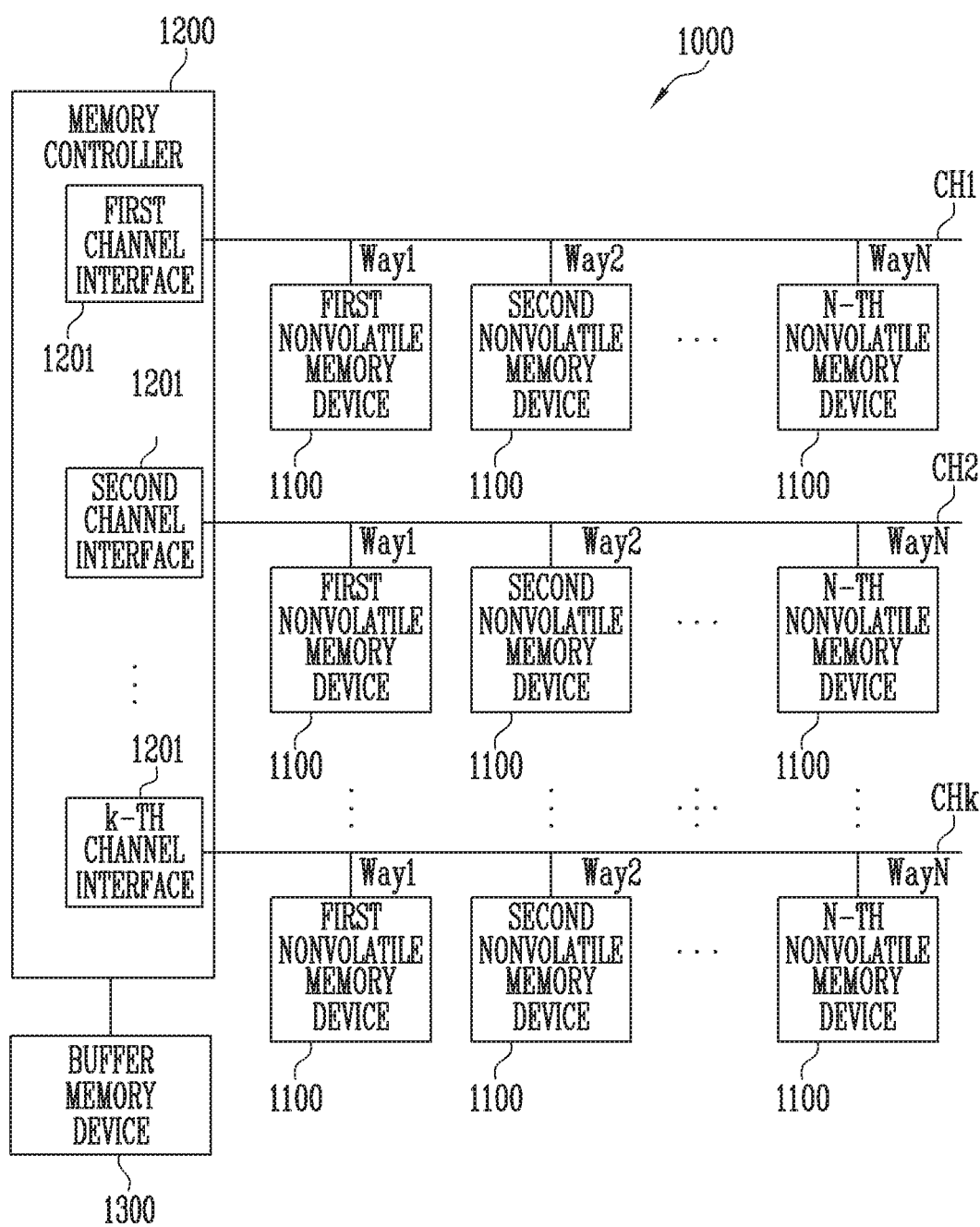
FIG. 3 is a diagram illustrating a memory system according to an embodiment of the present disclosure.

FIG. 3 is a diagram illustrating a memory system according to an embodiment of the present disclosure. FIG. 3 illustrates a memory system 1000 which includes a memory controller 1200 and a plurality of nonvolatile memory devices 1100 coupled to the memory controller 1200 through a plurality of channels CH1 to CHk. Such a memory system 1000 may be called a Solid State Drive (SSD).

Referring to FIG. 3, the memory controller 1200 may communicate with the plurality of nonvolatile memory devices 1100 through the plurality of channels CH1 to CHk. The memory controller 1200 may include a plurality of channel interfaces 1201, and each of the channels CH1 to CHk may be coupled to a corresponding one of the plurality of channel interfaces 1201. In an example, the first channel CH1 may be coupled to the first channel interface 1201, the second channel CH2 may be coupled to the second channel interface 1201, and the k-th channel CHk may be coupled to the k-th channel interface 1201. Each of the plurality of channels CH1 to CHk may be coupled to one or more nonvolatile memory devices 1100. Further, the nonvolatile memory devices 1100 coupled to different channels may be operated independently of each other. In other words, the nonvolatile memory devices 1100 coupled to the first channel CH1 and the nonvolatile memory devices 1100 coupled to the second channel CH2 may be operated independently of each other. In an embodiment, the memory controller 1200 may exchange data or commands with the nonvolatile memory devices 1100 coupled to the second channel CH2 through the second channel CH2 in parallel while exchanging data or commands with the nonvolatile memory devices 1100 coupled to the first channel CH1 through the first channel CH1.

Each of the plurality of channels CH1 to CHk may be coupled to a plurality of nonvolatile memory devices 1100. Here, the plurality of nonvolatile memory devices 1100 coupled to one channel may configure a plurality of different ways respectively. In an example, N nonvolatile memory devices 1100 may be coupled to one channel, each of which may configure a different way. That is, the first to N-th nonvolatile memory devices 1100 may be coupled to the first channel CH1, wherein the first nonvolatile memory device 1100 may configure a first way Way1, the second nonvolatile memory device 1100 may configure a second way Way2, and the N-th nonvolatile memory device 1100 may configure an N-th way WayN. In another embodiment, different than that shown in FIG. 2, two or more nonvolatile memory devices 1100 may configure a single way.

Since the first to N-th nonvolatile memory devices 1100 coupled to CH1 share CH1, they may sequentially exchange data or commands with the memory controller 1200 rather than simultaneously exchanging data or commands in parallel with the memory controller 1200. In other words, the second to N-th nonvolatile memory devices 1100, which configure ways Way2 to WayN, of CH1, may not exchange data or commands with the memory controller 1200 through CH1 while the memory controller 1200 is transmitting data to the first Way1-configuring nonvolatile memory device 1100 of CH1, through CH1. That is, while any one of the nonvolatile memory devices 1100 sharing CH1 occupies CH1, remaining nonvolatile memory devices 1100 coupled to CH1 may not use CH1.

However, the first Way1-configuring nonvolatile memory device 1100 of CH1 and the first Way1-configuring nonvolatile memory device 1100 of CH2 may independently communicate with the memory controller 1200. In other words, the memory controller 1200 may exchange data with the first Way1-configuring nonvolatile memory device 1100 of CH2, through CH2 and the second channel interface 1201, while exchanging data with the first Way1-configuring nonvolatile memory device 1100 of CH1, through CH1 and the first channel interface 1201.

Figure 4:
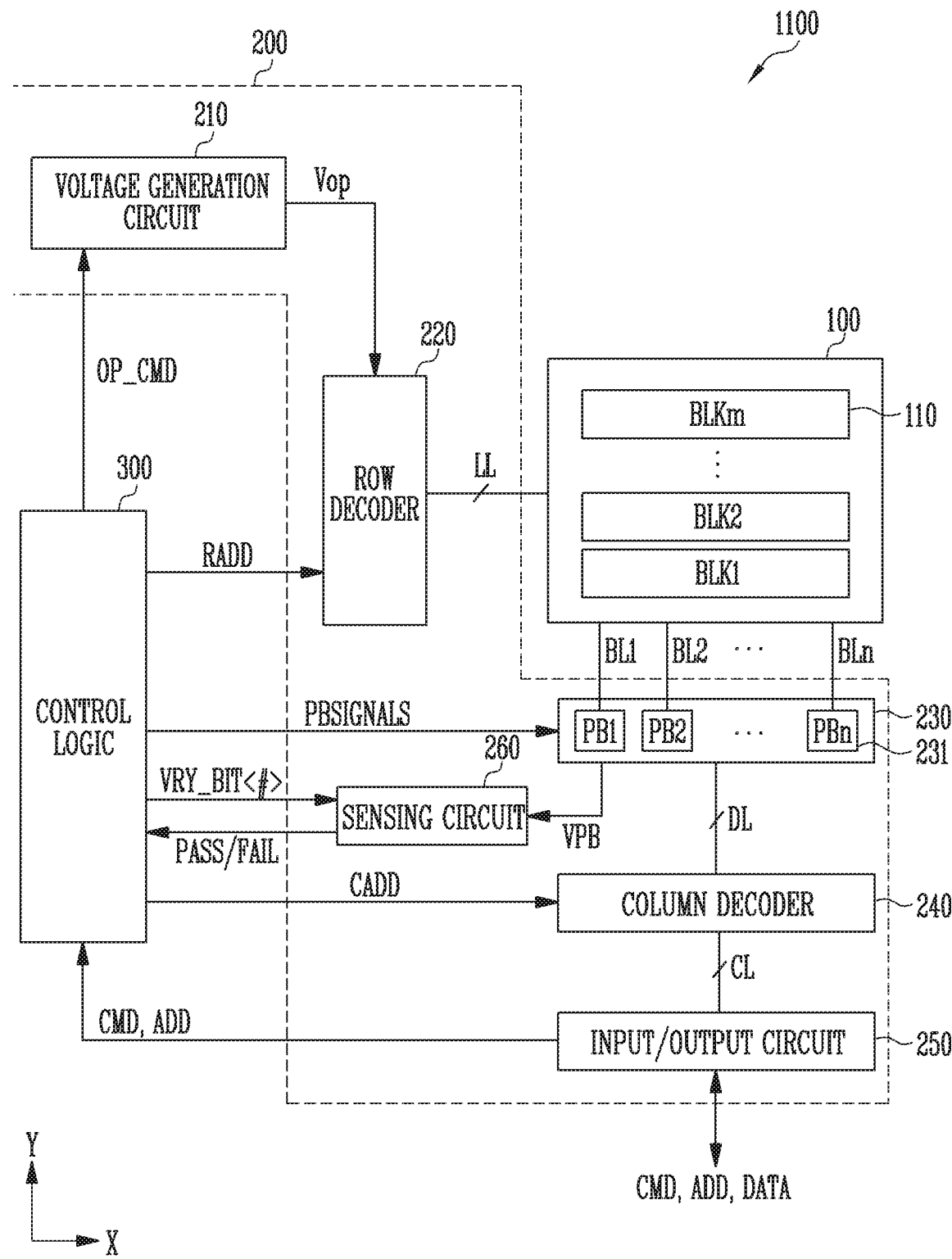
FIG. 4 is a diagram illustrating a nonvolatile memory device of FIG. 1.

FIG. 4 is a diagram illustrating the nonvolatile memory device of FIG. 1.

Referring to FIG. 4, the nonvolatile memory device 1100 may include a memory cell array 100 in which data is stored. The nonvolatile memory device 1100 may also include peripheral circuits 200, which perform a program operation for storing data in the memory cell array 100, a read operation for outputting stored data, and an erase operation for erasing stored data. The nonvolatile memory device 1100 may include a control logic 300, which controls the peripheral circuits 200 under the control of a memory controller (e.g., 1200 of FIG. 1).

The memory cell array 100 may include a plurality of memory blocks BLK1 to BLKm 110 (where m is a positive integer). Local lines LL and bit lines BL1 to BLn (where n is a positive integer) may be coupled to each of the memory blocks BLK1 to BLKm 110. For example, the local lines LL may include a first select line, a second select line, and a plurality of word lines arranged between the first and second select lines. Further, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines. For example, the local lines LL may further include dummy lines. For example, the local lines LL may further include pipelines. The local lines LL may be coupled to the memory blocks BLK1 to BLKm 110, respectively, and the bit lines BL1 to BLn may be coupled in common to the memory blocks BLK1 to BLKm 110. The memory blocks BLK1 to BLKm 110 may be implemented as a two-dimensional (2D) or a three-dimensional (3D) structure. For example, the memory cells in the memory blocks 110 having a 2D structure may be arranged horizontally on a substrate. For example, memory cells in the memory blocks 110 having a 3D structure may be stacked vertically on the substrate.

The peripheral circuits 200 may be configured to perform a program, read or erase operation on a selected memory block 110 under the control of the control logic 300. For example, the peripheral circuits 200 may supply a verify voltage and pass voltages to the first select line, the second select line, and the word lines, may selectively discharge the first select line, the second select line, and the word lines, and may verify memory cells coupled to a word line selected from among the word lines, under the control of the control logic 300. For example, the peripheral circuits 200 may include a voltage generation circuit 210, a row decoder 220, a page buffer group 230, a column decoder 240, an input/output circuit 250, and a sensing circuit 260.

The voltage generation circuit 210 may generate various operation voltages Vop used for program, read and erase operations in response to an operation signal OP_CMD. Further, the voltage generation circuit 210 may selectively discharge the local lines LL in response to the operation signal OP_CMD. For example, the voltage generation circuit 210 may generate a program voltage, a verify voltage, pass voltages, a turn-on voltage, a read voltage, an erase voltage, a source line voltage, etc. under the control of the control logic 300.

The row decoder 220 may transfer the operation voltages Vop to the local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may be operated in response to page buffer control signals PBSIGNALS. For example, the page buffers PB1 to PBn 231 may temporarily store data received through the bit lines BL1 to BLn or may sense the voltages or currents of the bit lines BL1 to BLn during a read or a verify operation.

The column decoder 240 may transfer data between the input/output circuit 250 and the page buffer group 230 in response to a column address CADD. For example, the column decoder 240 may exchange data with the page buffers 231 through data lines DL or may exchange data with the input/output circuit 250 through column lines CL.

The input/output circuit 250 may transmit a command CMD and an address ADD, received from the memory controller (e.g., 1200 of FIG. 1), to the control logic 300, or may exchange data DATA with the column decoder 240.

The sensing circuit 260 may generate a reference current in response to an enable bit VRY_BIT<#> and may output a pass signal PASS or a fail signal FAIL by comparing a sensing voltage VPB, received from the page buffer group 230, with a reference voltage, generated based on the reference current, during the read operation or the verify operation.

The control logic 300 may control the peripheral circuits 200 by outputting the operation signal OP_CMD, the row address RADD, the page buffer control signals PBSIGNALS, and the enable bit VRY_BIT<#>, and the column address CADD in response to the command CMD and the address ADD. Further, the control logic 300 may determine whether a verify operation has passed or failed in response to a pass or fail signal PASS or FAIL.

In the operation of the nonvolatile memory device 1100, each memory block 110 may be the unit of an erase operation. That is, a plurality of memory cells in one memory block 110 may be simultaneously erased, but may not be selectively erased.

Figure 5:
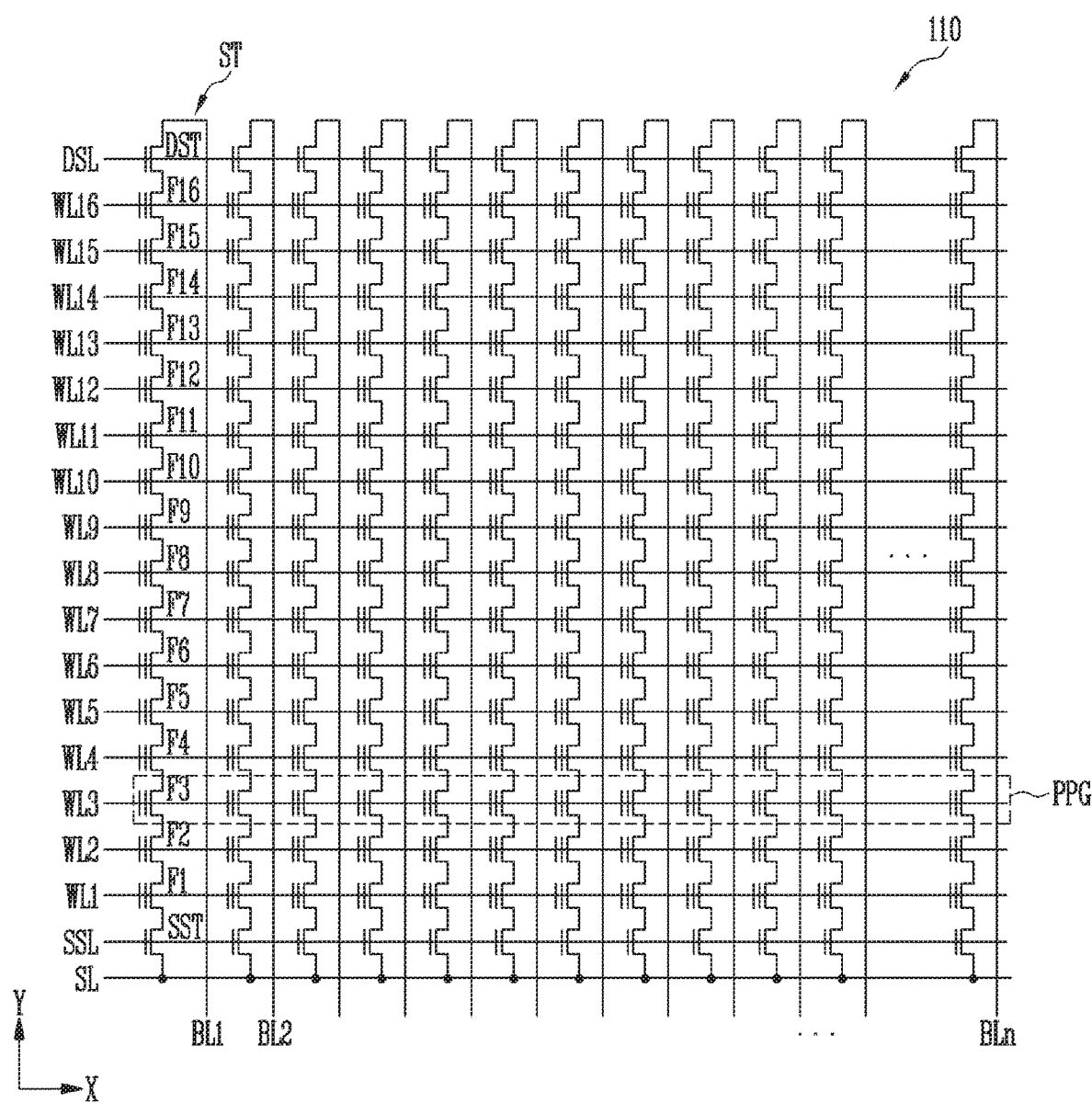
FIG. 5 is a diagram illustrating a memory block of FIG. 4.

FIG. 5 is a diagram illustrating the memory block of FIG. 4.

Referring to FIG. 5, the memory block 110 may be configured such that a plurality of word lines, which are arranged in parallel, are coupled between a first select line and a second select line. Here, the first select line may be a source select line SSL, and the second select line may be a drain select line DSL. In detail, the memory block 110 may include a plurality of strings ST coupled between bit lines BL1 to BLn and a source line SL. The bit lines BL1 to BLn may be respectively coupled to the strings ST, and the source line may be coupled in common to the strings ST. Since the strings ST may have the same configuration, a string ST coupled to the first bit line BL1 will be described in detail by way of example.

The string ST may include a source select transistor SST, a plurality of memory cells F1 to F16, and a drain select transistor DST, which are connected in series between the source line SL and the first bit line BL1. A single string ST may include one or more source select transistors SST and drain select transistors DST, and may include more memory cells than the memory cells F1 to F16 illustrated in the drawing.

A source of the source select transistor SST may be coupled to the source line SL and a drain of the drain select transistor DST may be coupled to the first bit line BL1. The memory cells F1 to F16 may be connected in series between the source select transistor SST and the drain select transistor DST. Gates of the source select transistors SST in different strings ST may be coupled to a source select line SSL, gates of the drain select transistors DST may be coupled to a drain select line DSL, and gates of the memory cells F1 to F16 may be coupled to a plurality of word lines WL1 to WL16. A group of memory cells in different strings ST and coupled to the same word line may be referred to as a "physical page PPG." Therefore, a number of physical pages PPG, which is the same as the number of word lines WL1 to WL16, may be included in the memory block 110.

One memory cell (MC) may store one bit of data. This is typically referred to as a single-level cell (SLC). In this case, one physical page PPG may store data corresponding to one logical page LPG. The data corresponding to one logical page LPG may include a number of data bits identical to the number of cells in one physical page PPG. Further, one memory cell (MC) may include two or more bits of data. This cell is typically referred to as a multi-level cell (MLC). Here, one physical page PPG may store data corresponding to two or more logical pages LPG.

When the memory cell stores two bits of data, one physical page PPG may include two pages PG. Here, one page PG may store data corresponding to one logical page LPG. One memory cell may have any one of a plurality of threshold voltages according to data, and a plurality of pages PG in one physical page PPG may be represented by threshold voltage differences.

The plurality of memory cells in one physical page PPG may be simultaneously programmed. That is, the nonvolatile memory device 1100 may perform a program operation on each physical page PPG. The plurality of memory cells in one memory block may be simultaneously erased. That is, the nonvolatile memory device 1100 may perform an erase operation on each memory block 110. In an embodiment, in order to update part of data stored in one memory block 110, the entire data stored in the memory block 110 may be read, and part of the read data to be updated may be changed, after which the entire data may be programmed to another memory block 110.

Figure 6:
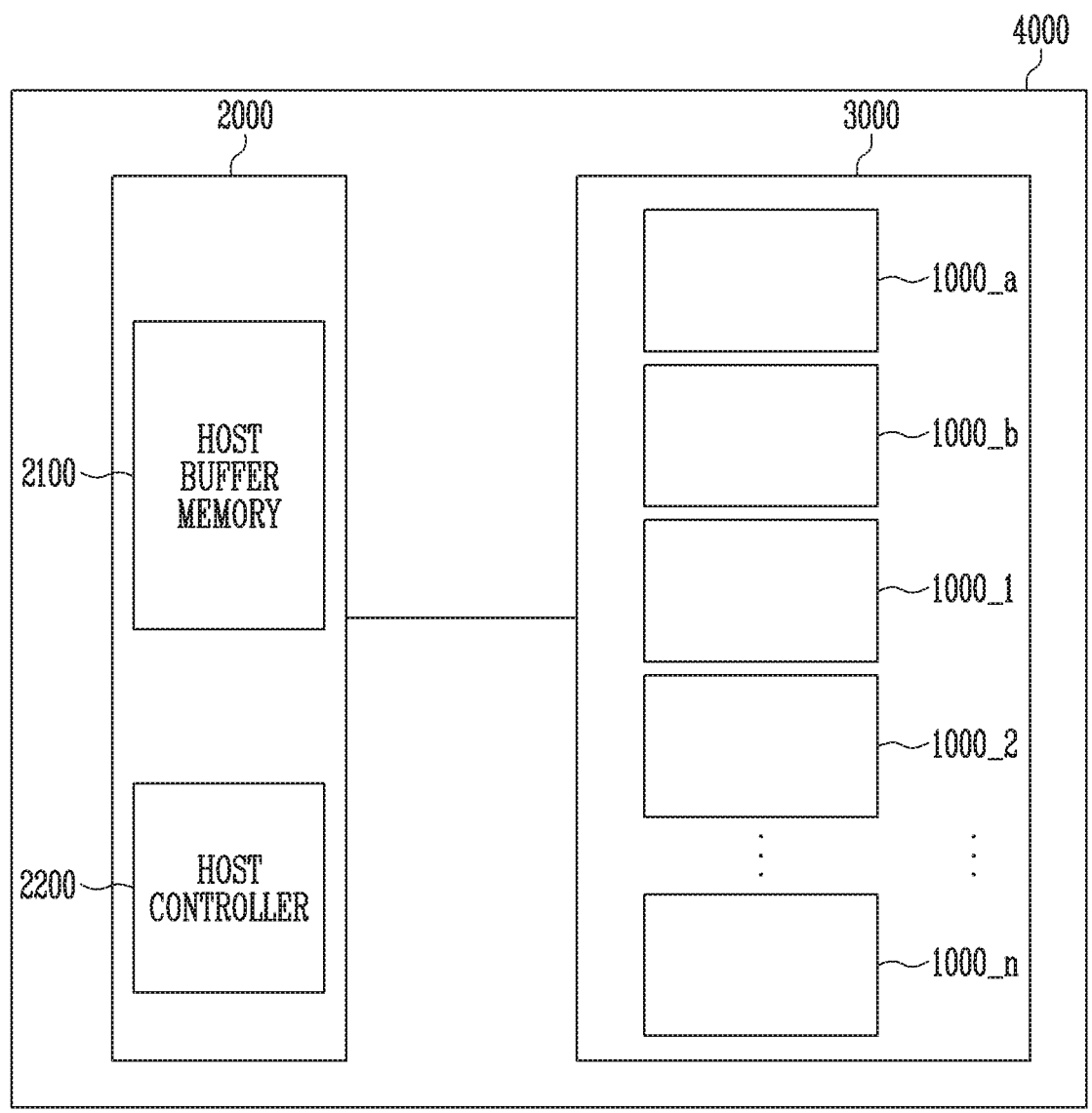
FIG. 6 is a diagram illustrating a storage system according to an embodiment of the present disclosure.

FIG. 6 is a diagram illustrating a storage system according to an embodiment of the present disclosure.

Referring to FIG. 6, a storage system 4000 may include a host system 2000 and a flash array 3000. The host system 2000 may include a host buffer memory 2100 and a host controller 2200. Further, the flash array 3000 may include a plurality of memory systems 1000. The memory systems 1000 may be SSDs.

The flash array 3000 may include first to n-th memory systems 1000_1 to 1000_n (where n is a natural number of 2 or more), and each of the first to n-th memory systems 1000_1 to 1000_n may be a user SSD for storing user data. Also, the flash array 3000 may include a-th and b-th memory systems 1000_a and 1000_b, and each of the a-th and b-th memory systems 1000_a and 1000_b may be a meta SSD for storing metadata. In an embodiment, the flash array 3000 may include one of the a-th and b-th memory systems 1000_a and 1000_b, that is, only a single meta SSD.

Each of the user SSDs 1000_1 to 1000_n may receive a write command, a logical address, and write data from the host controller 2200 of the host system 2000, and may map the logical address to a physical address in response to the write command. Further, each of the user SSDs 1000_1 to 1000_n may temporarily store mapping data between the logical address and the physical address in the controller buffer memory. The mapping data between the logical address and the physical address may be called logical-physical address mapping data. In an example, each of the user SSDs 1000_1 to 1000_n may update the logical-physical address mapping data stored in the controller buffer memory, based on the mapping data between the logical address and the physical address which is newly generated in response to the write command.

Each of the user SSDs 1000_1 to 1000_n may temporarily store first the write data received from the host system 2000 in the controller buffer memory. Thereafter, each of the user SSDs 1000_1 to 1000_n may program the write data, temporarily stored in the controller buffer memory, to the nonvolatile memory device 1100 based on the logical-physical address mapping data. That is, each of the user SSDs 1000_1 to 1000_n may store the write data in the storage space of the nonvolatile memory device 1100 corresponding to the physical address. The write data may be user data received by the storage system 4000 from a user. In other words, the user data may be provided from a source external to the storage system 4000.

Each of the user SSDs 1000_1 to 1000_n may fetch the write data stored in the host buffer memory 2100 of the host system 2000 before a write operation is initiated, and may temporarily store the fetched data in the controller buffer memory. In an example, the flash array 3000 and the host system 2000 may exchange data with each other through a NonVolatile Memory express (NVMe) interface method. In this case, each of the user SSDs 1000_1 to 1000_n may directly access the host buffer memory 2100 of the host system 2000 without requiring a separate input/output (JO) protocol. In an example, the host system 2000 may provide each of the user SSDs 1000_1 to 1000_n with location information of a space, in which the write data is stored, in the host buffer memory 2100. Furthermore, when a write command is inputted from the host system 2000, each of the user SSDs 1000_1 to 1000_n may access the host buffer memory 2100 of the host system 2000 based on the location information, fetch the write data, and temporarily store the fetched data in the controller buffer memory.

Each of the user SSDs 1000_1 to 1000_n may receive a read command and a logical address from the host controller 2200 of the host system 2000. In response to the read command, each of the user SSDs 1000_1 to 1000_n may check a physical address mapped to the logical address inputted from the host system 2000, based on the logical-physical address mapping data that is temporarily stored in the controller buffer memory. Also, each of the user SSDs 1000_1 to 1000_n may read the read data, stored in the storage space of the nonvolatile memory device 1100 corresponding to the physical address, and may temporarily store the read data in the controller buffer memory. Thereafter, each of the user SSDs 1000_1 to 1000_n may output the read data, temporarily stored in the controller buffer memory, to the host system 2000.

The host controller 2200 of the host system 2000 may fetch the read data, temporarily stored in the controller buffer memory of each of the user SSDs 1000_1 to 1000_n, and may temporarily store the fetched data in the host buffer memory 2100. In an example, the flash array 3000 and the host system 2000 may communicate with each other through a NonVolatile Memory express (NVMe) interface method. In this case, the host system 2000 may directly access the controller buffer memory of each of the user SSDs 1000_1 to 1000_n without requiring a separate IO protocol. Therefore, the host system 2000 may receive a read completion signal, indicating that read data has been stored in the controller buffer memory, from each of the user SSDs 1000_1 to 1000_n. Further, when receiving the read completion signal, the host system 2000 may access the controller buffer memory of each of the user SSDs 1000_1 to 1000_n, fetch the read data, and load the fetched data into the host buffer memory 2100.

The meta SSDs 1000_a and 1000_b may store metadata for internal operation of the storage system 4000. In an example, the meta SSDs 1000_a and 1000_b may store metadata for internal operations of the first to n-th user SSDs 1000_1 to 1000_n. In an example, the metadata may include logical-physical address mapping data of each of the first to n-th user SSDs 1000_1 to 1000_n. In other words, unlike user data, the metadata may be generated by the storage system 4000 by the internal operation thereof. In an example, each of the meta SSDs 1000_a and 1000_b may be a dedicated SSD for storing metadata. Further, the first to n-th user SSDs 1000_1 to 1000_n may use the metadata stored in the meta SSDs 1000_a and 1000_b without separately storing metadata for respective internal operations thereof in the nonvolatile memory devices 1100 provided in the first to n-th user SSDs 1000_1 to 1000_n.

The meta SSDs 1000_a and 1000_b may store metadata required for the operation of the storage system 4000 in the respective nonvolatile memory devices 1100 in the meta SSDs. In an example, the metadata may include pieces of logical-physical address mapping data of the first to n-th user SSDs 1000_1 to 1000_n, that is, first to n-th pieces of logical-physical address mapping data.

When the storage system 4000 is powered on, the host controller 2200 of the host system 2000 may provide a read command for metadata to the meta SSDs 1000_a and 1000_b. Each of the memory controllers 1200 of the meta SSDs 1000_a and 1000_b may read metadata stored in the corresponding nonvolatile memory device 1100 in response to the read command, and may temporarily store the metadata in the controller buffer memory. Thereafter, the meta SSDs 1000_a and 1000_b may output the metadata, temporarily stored in the respective controller buffer memories of the meta SSDs 1000_a and 1000_b, to the host system 2000, which may temporarily store such metadata in the host buffer memory 2100.

In an example, each of the meta SSDs 1000_a and 1000_b may read metadata from the corresponding nonvolatile memory device 1100, temporarily store the read metadata in the controller buffer memory, and thereafter transmit a read completion signal to the host system 2000. In response to the read completion signal, the host controller 2200 may directly access the controller buffer memory of each of the meta SSDs 1000_a and 1000_b, fetch the temporarily stored metadata, and then temporarily store the fetched metadata in the host buffer memory 2100.

The host controller 2200 may input a write command and pieces of metadata corresponding to respective user SSDs (i.e., user SSDs 1000_1 to 1000_n). In detail, the host controller 2200 may input the write command and first logical-physical address mapping data, corresponding to the first user SSD 1000_1, to the first user SSD 1000_1. The first user SSD 1000_1 may temporarily store the first logical-physical address mapping data in the controller buffer memory thereof in response to the write command. Further, the host controller 2200 may input the write command and second logical-physical address mapping data, corresponding to the second user SSD 1000_2, to the second user SSD 1000_2. The second user SSD 1000_2 may temporarily store the second logical-physical address mapping data in the controller buffer memory thereof in response to the write command. Also, the host controller 2200 may input the write command and n-th logical-physical address mapping data, corresponding to the n-th user SSD 1000_n, to the n-th user SSD 1000_n. The n-th user SSD 1000_n may temporarily store the n-th logical-physical address mapping data in the controller buffer memory thereof in response to the write command.

The above-described metadata write operations for the first to n-th user SSDs 1000_1 to 1000_n may be performed in parallel or may be sequentially performed.

In an embodiment, each of the first to n-th user SSDs 1000_1 to 1000_n may directly access the host buffer memory 2100, fetch temporarily stored metadata, and then load the fetched metadata into the corresponding controller buffer memory in response to the write command. That is, the host controller 2200 may notify the first to n-th user SSDs 1000_1 to 1000_n of locations in the host buffer memory 2100 in which the first to n-th pieces of logical-physical address mapping data respectively corresponding to the first to n-th user SSDs are stored. The first to n-th user SSDs 1000_1 to 1000_n may directly access the host buffer memory 2100 based on the location information, fetch the corresponding logical-physical address mapping data, and load the fetched data into the respective controller buffer memories.

For example, a write command for writing metadata may be different from a write command for writing user data. In response to the write command for writing the user data, the user SSDs 1000_1 to 1000_n may temporarily store user data in the controller buffer memories and thereafter program the user data to the nonvolatile memory devices 1100. Conversely, in response to the write command for writing metadata, the user SSDs 1000_1 to 1000_n may temporarily store metadata in the controller buffer memories and may not program the metadata to the nonvolatile memory devices 1100.

The host controller 2200 may read the metadata, temporarily stored in the respective controller buffer memories of the user SSDs 1000_1 to 1000_n, and may temporarily store the read metadata in the host buffer memory 2100. In an embodiment, the host controller 2200 may provide a read command to the first user SSD 1000_1, and the first user SSD 1000_1 may output the first logical-physical address mapping data, temporarily stored in the controller buffer memory thereof, to the host system 2000 in response to the read command. The host system 2000 may temporarily store the first logical-physical address mapping data, outputted from the first user SSD 1000_1, in the host buffer memory 2100. Further, the host controller 2200 may provide a read command to the second user SSD 1000_2, and the second user SSD 1000_2 may output the second logical-physical address mapping data, temporarily stored in the controller buffer memory thereof, to the host system 2000 in response to the read command. The host system 2000 may temporarily store the second logical-physical address mapping data, outputted from the second user SSD 1000_2, in the host buffer memory 2100. Also, the host controller 2200 may provide a read command to the n-th user SSD 1000_n, and the n-th user SSD 1000_n may output the n-th logical-physical address mapping data, temporarily stored in the controller buffer memory thereof, to the host system 2000 in response to the read command. The host system 2000 may temporarily store the n-th logical-physical address mapping data, outputted from the n-th user SSD 1000_n, in the host buffer memory 2100.

The above-described operations of reading the first to n-th pieces of logical-physical address mapping data may be performed in parallel, or alternatively may be sequentially performed.

In an example, a read command for reading metadata may be different from a read command for reading user data. In response to the read command for reading the user data, the user SSDs 1000_1 to 1000_n may read the user data, temporarily stored in the nonvolatile memory devices 1100 thereof, may temporarily store the read user data in the controller buffer memories, and may then output the user data to the host system 2000. Conversely, in response to the read command for reading the metadata, the user SSDs 1000_1 to 1000_n may directly output the metadata, temporarily stored in the controller buffer memories, to the host system 2000 without performing a separate read operation on the nonvolatile memory devices 1100.

In an example, the host controller 2200 may directly access the respective controller buffer memories of the user SSDs 1000_1 to 1000_n, may fetch the metadata stored in the controller buffer memories, and may load the fetched metadata into the host buffer memory 2100. In an embodiment, the flash array 3000 and the host system 2000 may communicate with each other through an NVMe interface method. In this case, the host system 2000 may directly access the controller buffer memories of the user SSDs 1000_1 to 1000_n without requiring a separate IO protocol.

The host system 2000 may perform the operation of writing the metadata, temporarily stored in the host buffer memory 2100, to the a-th and b-th meta SSDs 1000_a and 1000_b. The host system 2000 may input a write command and metadata, temporarily stored in the host buffer memory 2100, to the a-th and b-th meta SSDs 1000_a and 1000_b. The a-th and b-th meta SSDs 1000_a and 1000_b may temporarily store the metadata in the controller buffer memories thereof and thereafter program the metadata, temporarily stored in the controller buffer memories, to the nonvolatile memory devices 1100 thereof in response to the write command.

In an example, the host system 2000 may input the write command and information about locations at which the metadata is stored in the host buffer memory 2100 to the a-th and b-th meta SSDs 1000_a and 1000_b. The a-th and b-th meta SSDs 1000_a and 1000_b may fetch the metadata, stored in the host buffer memory 2100, based on the location information, and load the fetched metadata into the controller buffer memories. Thereafter, the a-th and b-th meta SSDs 1000_a and 1000_b may program the metadata, loaded into the controller buffer memories, to the nonvolatile memory devices 1100.

As described above, the storage system 4000 may include separate SSDs for storing metadata, in addition to a plurality of SSDs that may be used only for storage of user data. Therefore, the plurality of SSDs for storing user data may not perform a separate operation of storing metadata, and thus the storage system 4000 may be efficiently operated.

Figure 7:
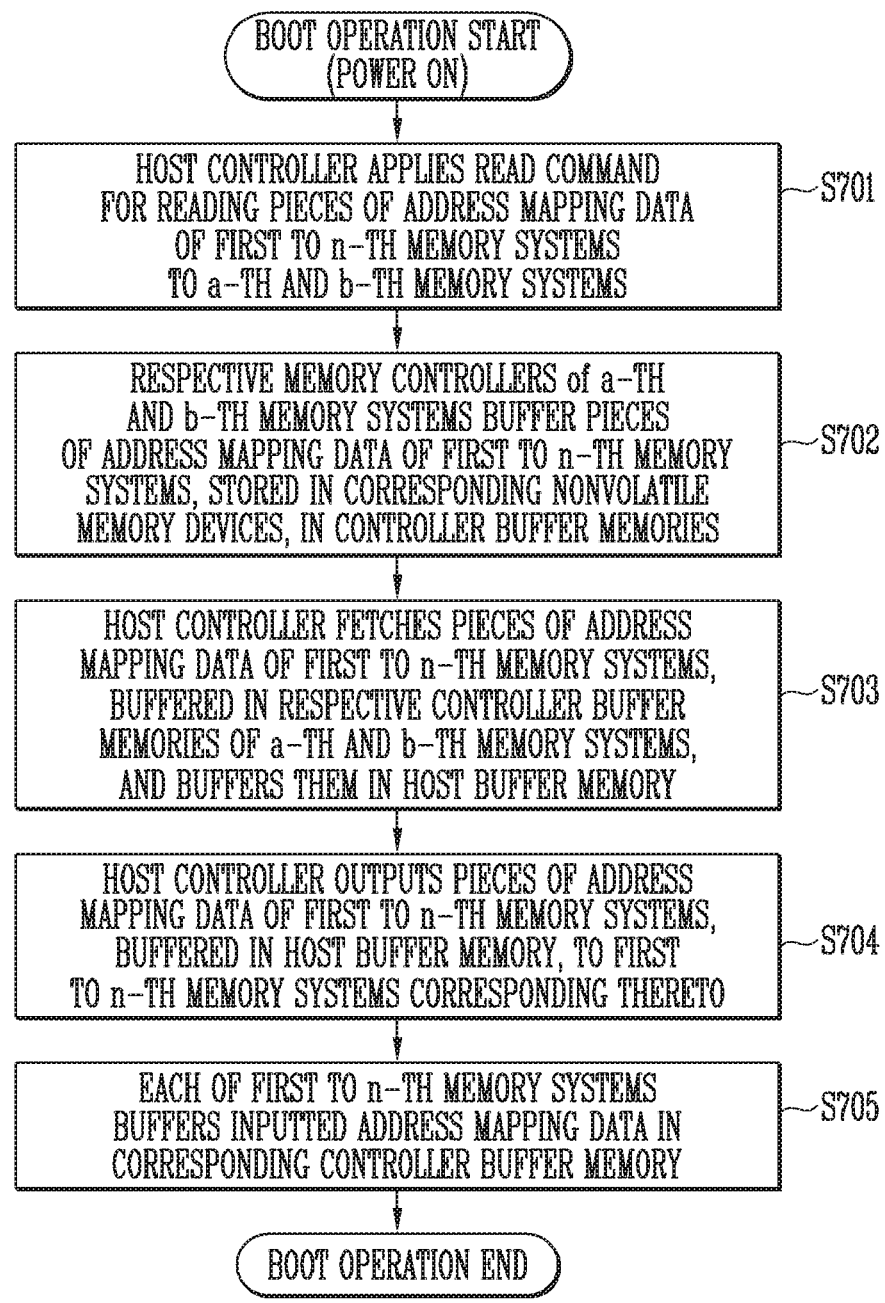
FIG. 7 is a flowchart illustrating a boot sequence according to an embodiment of the present disclosure.

FIG. 7 is a flowchart illustrating a boot sequence according to an embodiment of the present disclosure. Further, FIG. 8 is a diagram illustrating a boot sequence according to an embodiment of the present disclosure.

Figure 8:
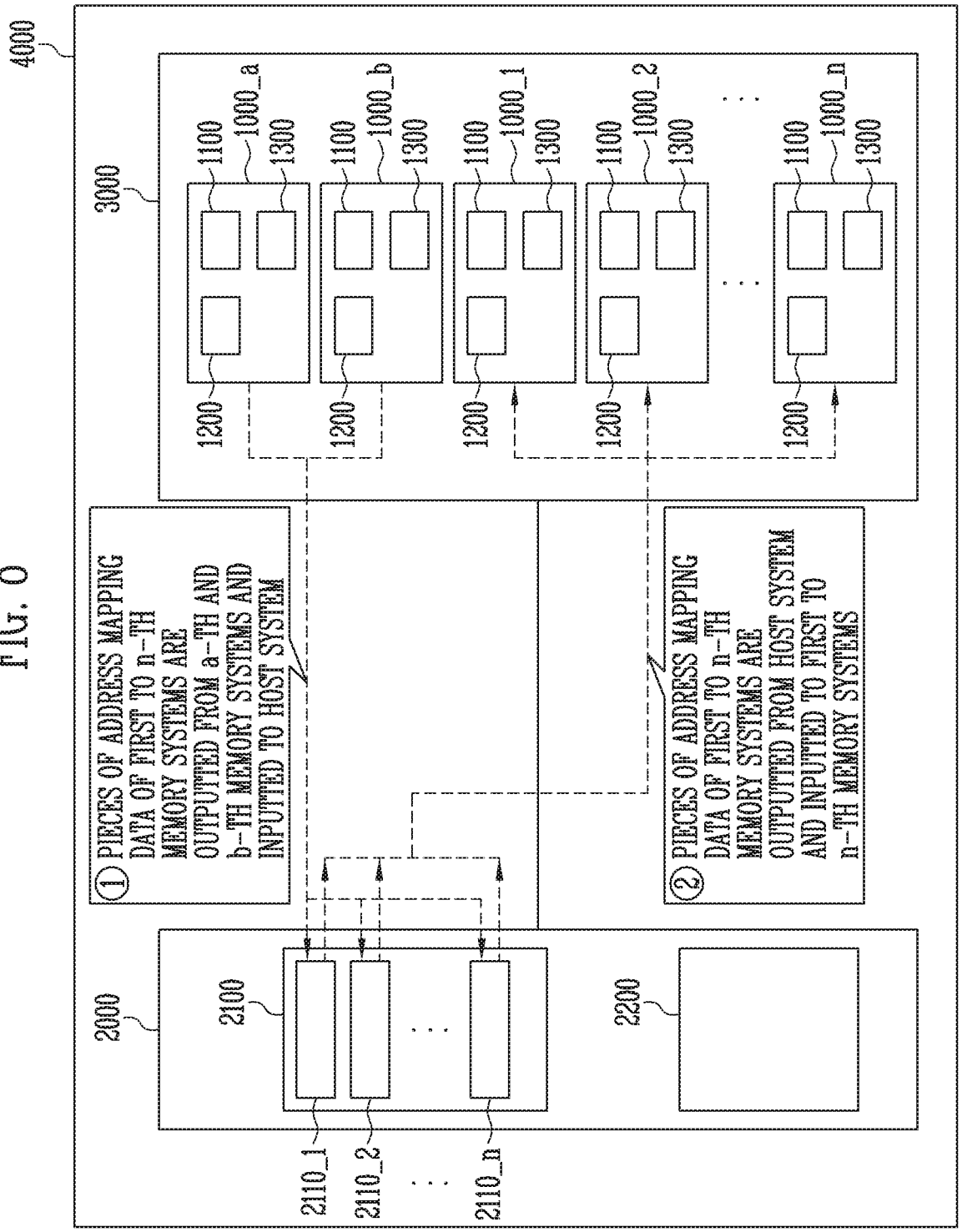
FIG. 8 is a diagram illustrating a boot sequence according to an embodiment of the present disclosure.

Referring to FIGS. 7 and 8, the storage system 4000 may perform a boot operation when the storage system 4000 is powered on. When the boot operation starts, the host controller 2200 may provide a read command for reading pieces of address mapping data of the first to n-th memory systems 1000_1 to 1000_n to the a-th and b-th memory systems 1000_a and 1000_b at step S701. The a-th and b-th memory systems 1000_a and 1000_b may be meta SSDs for storing metadata, and the first to n-th memory systems 1000_1 to 1000_n may be user SSDs for storing user data.

Respective memory controllers 1200 of the a-th and b-th memory systems 1000_a and 1000_b may read the pieces of address mapping data (i.e., first to n-th pieces of address mapping data) of the first to n-th memory systems 1000_1 to 1000_n stored in the nonvolatile memory devices 1100 respectively coupled to the memory controllers 1200, and may buffer the read address mapping data in the controller buffer memories at step S702. In an example, part of the first to n-th pieces of address mapping data may be stored in the a-th memory system 1000_a, and the remaining part thereof may be stored in the b-th memory system 1000_b. Here, the host controller 2200 may primarily read the part of the first to n-th pieces of address mapping data, stored in the a-th memory system 1000_a, and may secondarily read the remaining part of the first to n-th pieces of address mapping data, stored in the b-th memory system 1000_b.

The host controller 2200 may fetch the first to n-th pieces of address mapping data of the first to n-th memory systems 1000_1 to 1000_n, buffered in the controller buffer memories of the a-th and b-th memory systems 1000_a and 1000_b, and may buffer the fetched address mapping data in the host buffer memory 2100 at step S703.

In an example, the host controller 2200 may primarily access the controller buffer memory of the a-th memory system 1000_a and fetch the buffered part of the first to n-th pieces of address mapping to data, and may secondarily access the controller buffer memory of the b-th memory system 1000_b and fetch the buffered remaining part of the first to n-th pieces of address mapping data.

The host controller 2200 may buffer the part of the first to n-th pieces of address mapping data, fetched from the controller buffer memory of the a-th memory system 1000_a, in the host buffer memory 2100, and may buffer the remaining part of the first to n-th pieces of address mapping data, fetched from the controller buffer memory of the b-th memory system 1000_b, in the host buffer memory 2100.

The host controller 2200 may output the first to n-th pieces of address mapping data of the first to n-th memory systems 1000_1 to 1000_n, buffered in the host buffer memory 2100, to the first to n-th memory systems 1000_1 to 1000_n respectively at step S704. Such output in step S704 may be performed either sequentially or in parallel.

Each of the first to n-th memory systems 1000_1 to 1000_n may buffer the inputted address mapping data in the corresponding controller buffer memory at step S705. In other words, the first memory system 1000_1 may receive the first address mapping data, outputted from the host system 2000, and buffer the first address mapping data in the controller buffer memory thereof, and the second memory system 1000_2 may receive the second address mapping data, outputted from the host system 2000, and buffer the second address mapping data in the controller buffer memory thereof. Further, the n-th memory system 1000_n may receive the n-th address mapping data, outputted from the host system 2000, and buffer the n-th address mapping data in the controller buffer memory thereof.

In an embodiment, the first to n-th memory systems 1000_1 to 1000_n may access the host buffer memory 2100, fetch the first to n-th pieces of address mapping data, respectively, and store the first to n-th pieces of address mapping data in respective controller buffer memories. In detail, the host controller 2200 may notify the first memory system 1000_1 of a location in the host buffer memory 2100 in which the first address mapping data is stored, and the first memory system 1000_1 may access the host buffer memory 2100 based on the location information, fetch the first address mapping data, and buffer the first address mapping data in the controller buffer memory. In addition, the host controller 2200 may notify the second memory system 1000_2 of a location in the host buffer memory 2100 in which the second address mapping data is stored, and the second memory system 1000_2 may access the host buffer memory 2100 based on the location information, fetch the second address mapping data, and buffer the second address mapping data in the controller buffer memory. Also, the host controller 2200 may notify the n-th memory system 1000_n of a location in the host buffer memory 2100 in which the n-th address mapping data is stored, and the n-th memory system 1000_n may access the host buffer memory 2100 based on the location information, fetch the n-th address mapping data, and buffer the n-th address mapping data in the controller buffer memory.

Through the above-described operation, the storage system 4000 may complete the boot operation. Each of the first to n-th memory systems 1000_1 to 1000_n may perform a write operation and a read operation based on the address mapping data buffered in the controller buffer memory.

The host buffer memory 2100 may include a plurality of meta buffer memories 2110, that is, first to n-th meta buffer memories 2110_1 to 2110_n. When a boot operation is performed, the first to n-th pieces of address mapping data of the first to n-th memory systems 1000_1 to 1000_n, respectively, may be outputted from the a-th and b-th memory systems 1000_a and 1000_b and inputted to the host system 2000. Here, the first address mapping data corresponding to the first memory system 1000_1 may be stored in the first meta buffer memory 2110_1, the second address mapping data corresponding to the second memory system 1000_2 may be stored in the second meta buffer memory 2110_2, and the n-th address mapping data corresponding to the n-th memory system 1000_n may be stored in the n-th meta buffer memory 2110_n.

The host system 2000 may output the first address mapping data, stored in the first meta buffer memory 2110_1, to the first memory system 1000_1, which may buffer such first address mapping data in the controller buffer memory thereof. In addition, the host system 2000 may output the second address mapping data, stored in the second meta buffer memory 2110_2, to the second memory system 1000_2, which may buffer such second address mapping data in the controller buffer memory thereof. Also, the host system 2000 may output the n-th address mapping data, stored in the n-th meta buffer memory 2110_n, to the n-th memory system 1000_n, which may buffer such n-th address mapping data in the controller buffer memory thereof. The above-described series of operations may be sequentially performed.

In an embodiment, the host system 2000 may notify the first memory system 1000_1 of location information of the first meta buffer memory 2110_1, in which the first address mapping data is stored, in the host buffer memory 2100. The first memory system 1000_1 may fetch the first address mapping data, stored in the first meta buffer memory 2110_1, based on the location information, and may buffer the first address mapping data in the controller buffer memory. Further, the host system 2000 may notify the second memory system 1000_2 of location information of the second meta buffer memory 2110_2, in which the second address mapping data is stored, in the host buffer memory 2100. The second memory system 1000_2 may fetch the second address mapping data, stored in the second meta buffer memory 2110_2, based on the location information, and may buffer the second address mapping data in the controller buffer memory. Also, the host system 2000 may notify the n-th memory system 1000_n of location information of the n-th meta buffer memory 2110_n, in which the n-th address mapping data is stored, in the host buffer memory 2100. The n-th memory system 1000_n may fetch the n-th address mapping data, stored in the n-th meta buffer memory 2110_n, based on the location information, and may buffer the n-th address mapping data in the controller buffer memory. The above-described series of operations may be sequentially performed.

Figure 9:
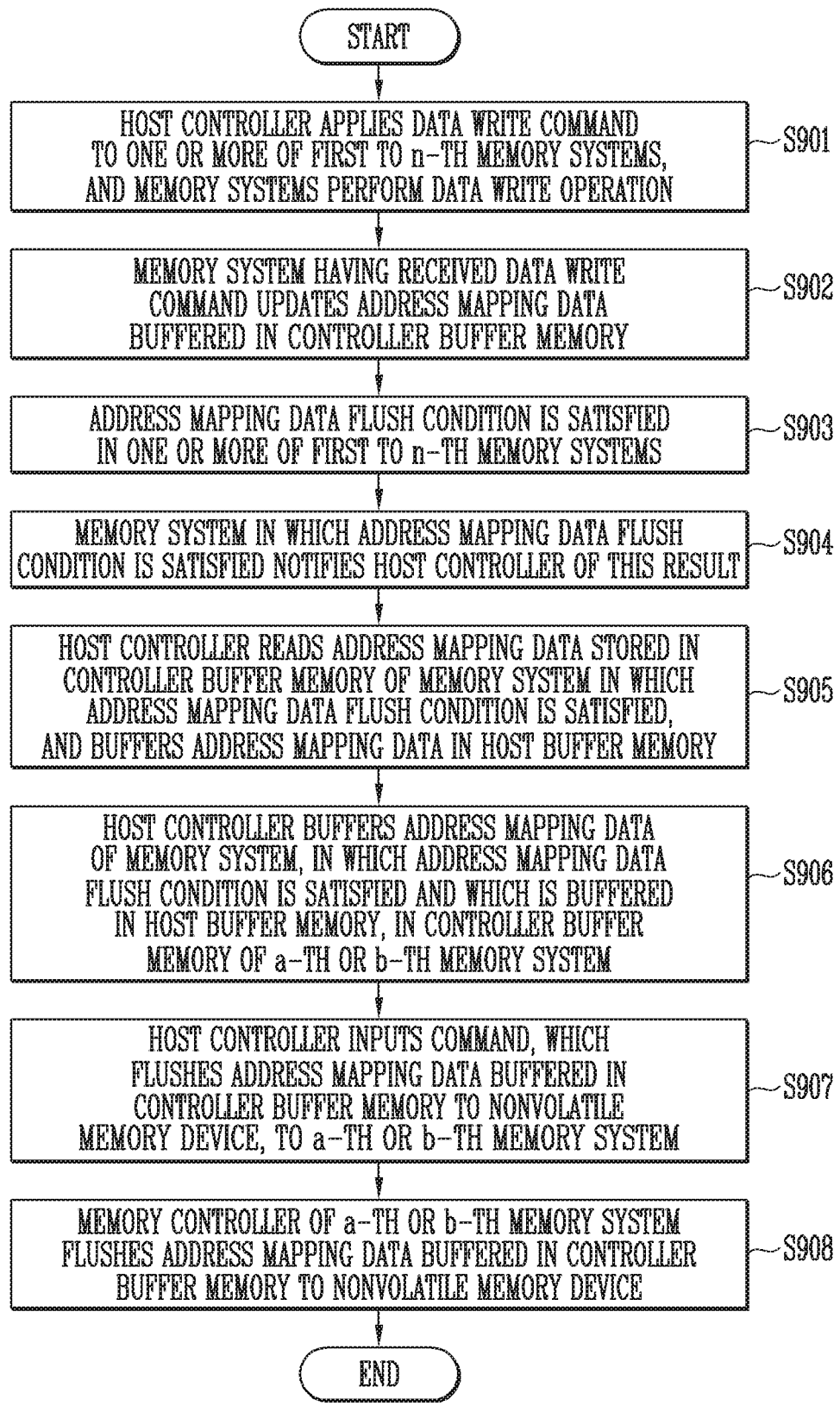
FIG. 9 is a flowchart illustrating a flush operation on address mapping data according to an embodiment of the present disclosure.

FIG. 9 is a flowchart illustrating a flush operation on address mapping data according to an embodiment of the present disclosure. Further, FIG. 10 is a diagram illustrating a flush operation on address mapping data according to an embodiment of the present disclosure.

Figure 10:
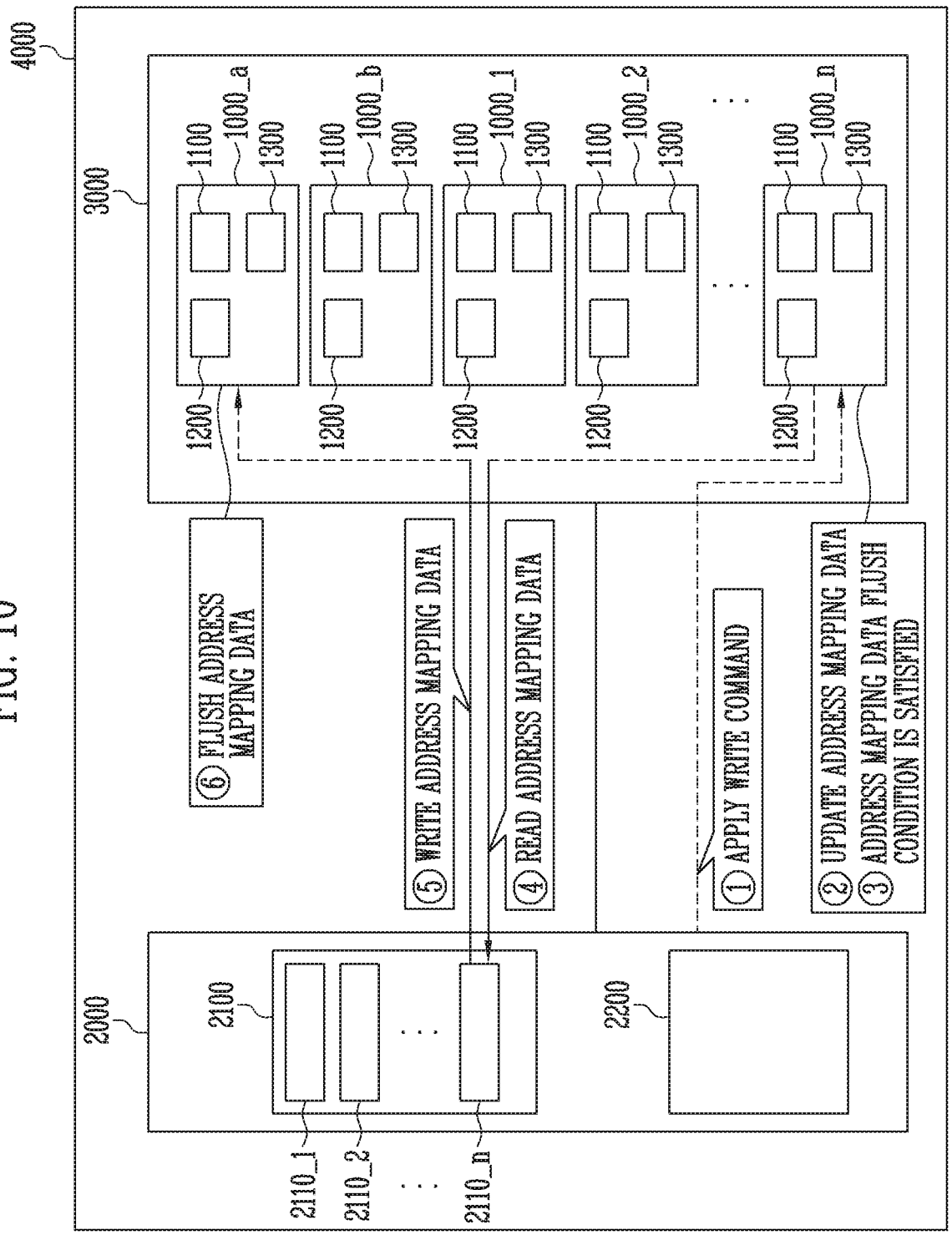
FIG. 10 is a diagram illustrating a flush operation on address mapping data according to an embodiment of the present disclosure.

Referring to FIGS. 9 and 10, the host controller 2200 may provide a data write command to one or more of the first to n-th memory systems 1000_1 to 1000_n at step S901.

The memory system, e.g., the n-th memory system 1000_n, having received the write command, may perform a data write operation. Here, the n-th memory system 1000_n may update address mapping data buffered in the controller buffer memory thereof at step S902.

In other words, the host controller 2200 may transmit a write command and a logical address to the n-th memory system 1000_n, and its memory controller 1200 may map a physical address to the logical address, and may update the address mapping data buffered in the controller buffer memory based on mapping data between the logical address and the physical address. Further, the n-th memory system 1000_n may program write data to the nonvolatile memory device 1100 based on the physical address. The first to n-th memory systems 1000_1 to 1000_n may be user SSDs for storing user data.

As the pieces of address mapping data of the first to n-th memory systems 1000_1 to 1000_n are updated, an address mapping data flush condition may be satisfied in one or more of the first to n-th memory systems 1000_1 to 1000_n at step S903. In an embodiment, the address mapping data flush condition may be satisfied when the extent of the update of the address mapping data stored in the controller buffer memory is greater than or equal to a set or predetermined level. In an example, when a difference between n-th address mapping data corresponding to the n-th memory system 1000_n, stored in the nonvolatile memory device 1100 of the a-th memory system 1000_a, and n-th address mapping data stored in the controller buffer memory of the n-th memory system 1000_n is greater than or equal to a set or predetermined level, the n-th memory system 1000_n may satisfy the address mapping data flush condition.

When the address mapping data flush condition is satisfied in a certain memory system, for example, in the n-th memory system 1000_n, the n-th memory system 1000_n may notify the host controller 2200 that the address mapping data flush condition has been satisfied at step S904.

The host controller 2200 may read the n-th address mapping data stored in the controller buffer memory of the n-th memory system 1000_n in which the address mapping data flush condition is satisfied, and may buffer the n-th address mapping data in the n-th meta buffer memory 2110_n, at step S905.

Thereafter, the host controller 2200 may output the n-th address mapping data of the n-th memory system 1000_n in which the address mapping data flush condition is satisfied and which is buffered in the n-th meta buffer memory 2110_n. The a-th or b-th memory system 1000_a or 1000_b may buffer the n-th address mapping data, outputted from the host buffer memory 2100, in the controller buffer memory at step S906. The a-th or b-th memory system 1000_1 or 1000_b may be a meta SSD for storing metadata.

In an embodiment, the host controller 2200 may notify the a-th memory system 1000_a of the location of the n-th meta buffer memory 2110_n in which the n-th address mapping data is buffered, and the a-th memory system 1000_a may fetch the n-th address mapping data from the n-th meta buffer memory 2110_n based on the location information and buffer the fetched data in the controller buffer memory.

The host controller 2200 may input a command, which flushes the address mapping data buffered in the controller buffer memory to the nonvolatile memory device 1100, to the a-th or b-th memory system 1000_a or 1000_b at step S907.

The memory controller 1200 of the a-th or b-th memory system 1000_a or 1000_b may flush the address mapping data buffered in the controller buffer memory to the nonvolatile memory device 1100 in the memory system 1000_a or 1000_b in response to the flush command at step S908.

In an embodiment, the host controller 2200 may input a write command and the location of the n-th meta buffer memory 2110_n, in which the n-th address mapping data is buffered, to the a-th memory system 1000_a. The a-th memory system 1000_a may fetch the n-th address mapping data from the n-th meta buffer memory 2110_n in response to the write command and the location information, buffer the n-th address mapping data in the controller buffer memory, and then program the n-th address mapping data, buffered in the controller buffer memory, to the nonvolatile memory device 1100 therein.

As in the case of the above-described operation, when any one of the plurality of user SSDs of the flash array 3000 satisfies a metadata flush condition, the storage system 4000 may read metadata, stored in the controller buffer memory of the user SSD in which the metadata flush condition is satisfied, and may flush the metadata to the meta SSD.

Figure 11:
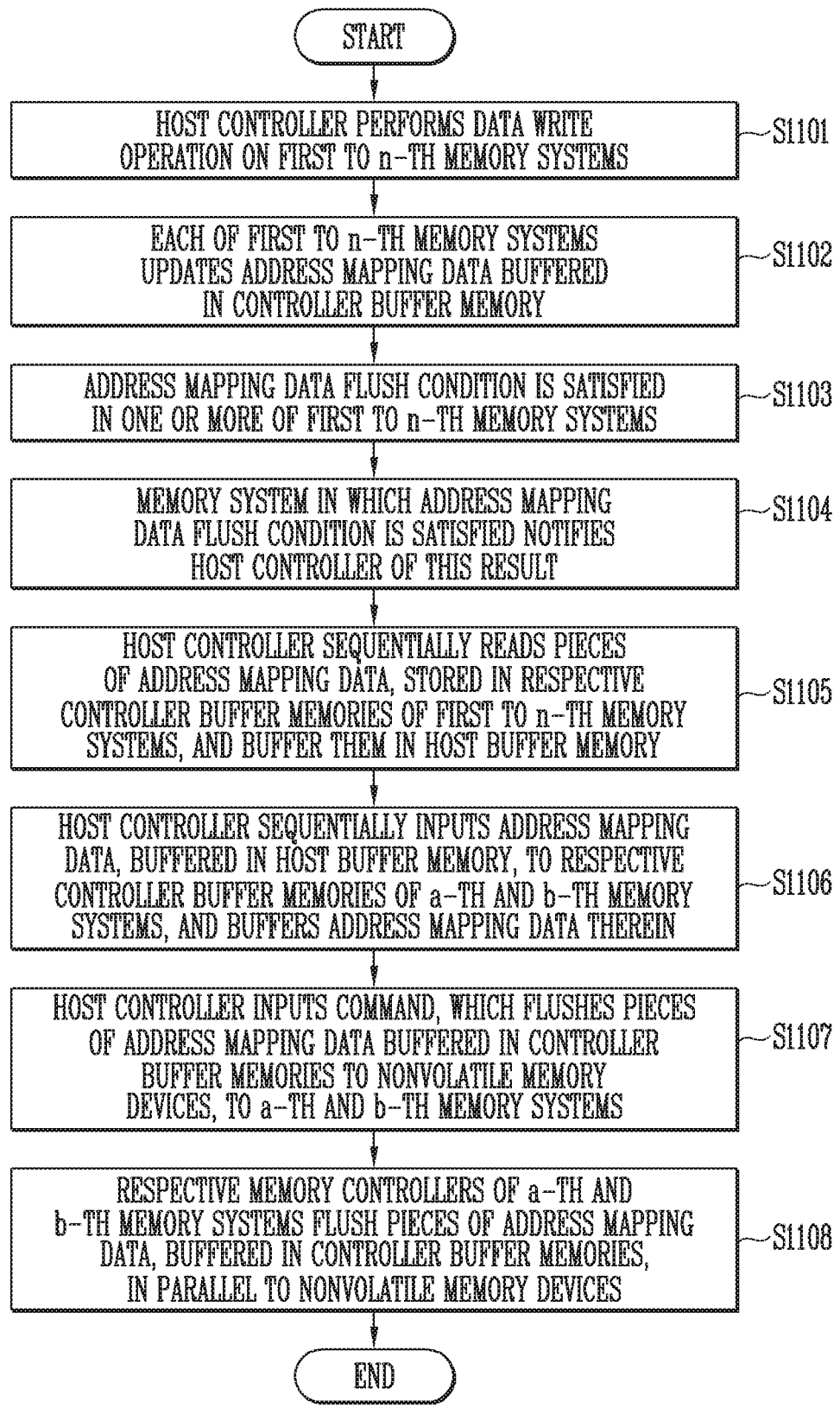
FIG. 11 is a flowchart illustrating a flush operation on address mapping data according to an embodiment of the present disclosure.

FIG. 11 is a flowchart illustrating a flush operation on address mapping data according to an embodiment of the present disclosure.

Referring to FIG. 11, the host controller 2200 may provide a data write command to one or more of the first to n-th memory systems 1000_1 to 1000_n at step S1101.

The memory system, e.g., the n-th memory system 1000_n, having received the write command, may perform a data write operation. Here, the n-th memory system 1000_n may update address mapping data buffered in the controller buffer memory thereof at step S1102.

In other words, the host controller 2200 may transmit a write command and a logical address to the n-th memory system 1000_n, and its memory controller 1200 may map a physical address to the logical address, and may update the address mapping data buffered in the controller buffer memory based on mapping data between the logical address and the physical address. Further, the n-th memory system 1000_n may program write data to the nonvolatile memory device 1100 based on the physical address.

As the pieces of address mapping data of the first to n-th memory systems 1000_1 to 1000_n are updated, an address mapping data flush condition may be satisfied in one or more of the first to n-th memory systems 1000_1 to 1000_n at step S1103. In an embodiment, the address mapping data flush condition may be satisfied when the extent of the update of the address mapping data is greater than or equal to a set or predetermined level.

When the address mapping data flush condition is satisfied in a certain memory system, for example, in the n-th memory system 1000_n, the n-th memory system 1000_n may notify the host controller 2200 that the address mapping data flush condition has been satisfied at step S1104.

The host controller 2200 may sequentially read pieces of address mapping data, stored in respective controller buffer memories of the first to n-th memory systems 1000_1 to 1000_n, and may buffer the read address mapping data in the host buffer memory 2100 at step S1105. In an embodiment, the host controller 2200 may sequentially input a read command to the first to n-th memory systems 1000_1 to 1000_n, and may buffer first to n-th pieces of address mapping data, sequentially outputted from the first to n-th memory systems 1000_1 to 1000_n, in the first to n-th meta buffer memories 2110_1 to 2110_n, respectively. In an embodiment, the host controller 2200 may sequentially access respective controller buffer memories of the first to n-th memory systems 1000_1 to 1000_n, fetch the first to n-th pieces of address mapping data, and load such data into the first to n-th meta buffer memories 2110_1 to 2110_n, respectively.

The host controller 2200 may sequentially input the first to n-th pieces of address mapping data, buffered in the first to n-th meta buffer memories 2110_1 to 2110_n of the host buffer memory 2100, to respective controller buffer memories of the a-th and b-th memory systems 1000_a and 1000_b. The a-th and b-th memory systems 1000_a and 1000_b may buffer the first to n-th pieces of address mapping data in their controller buffer memories at step S1106.

Further, the host controller 2200 may input a command, which flushes the pieces of address mapping data buffered in the controller buffer memories to the nonvolatile memory devices 1100, to the a-th and b-th memory systems 1000_a and 1000_b at step S1107.

The a-th and b-th memory systems 1000_a and 1000_b may flush the pieces of address mapping data, buffered in the corresponding controller buffer memories, to their nonvolatile memory devices 1100 in response to the command at step S1108.

As in the case of the above-described operation, when any one of the plurality of user SSDs of the flash array 3000 satisfies the metadata flush condition, the storage system 4000 may read the metadata, stored in the controller buffer memories of all user SSDs including user SSDs which do not satisfy the metadata flush condition, and may flush the read metadata to the meta SSDs.

Figure 12:
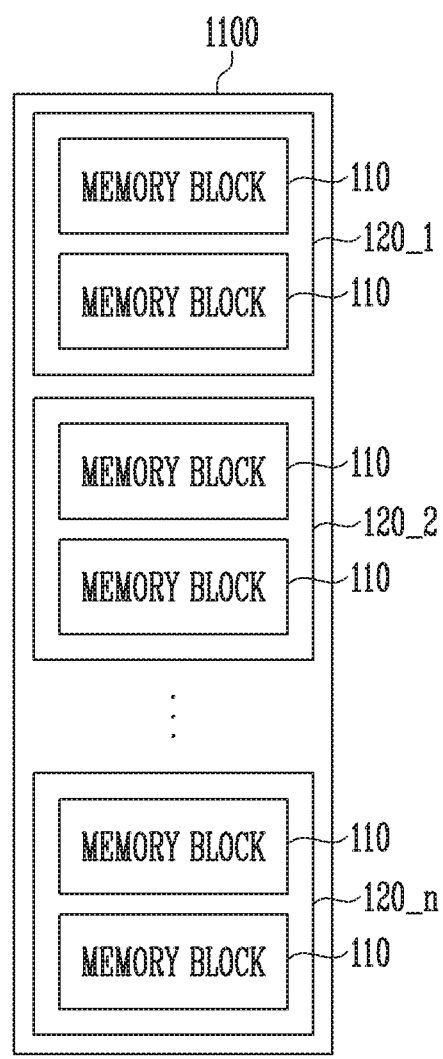
FIG. 12 is a diagram for explaining the configuration of a mapping data storage area according to an embodiment of the present disclosure.

FIG. 12 is a diagram for explaining the configuration of a mapping data storage area according to an embodiment of the present disclosure.

Referring to FIG. 12, a storage system 4000 may use a single memory system 1000 as a meta SSD. The memory system 1000 used as the meta SSD may store metadata, for example, first to n-th pieces of address mapping data, about the first to n-th user SSDs 1000_1 to 1000_n in a nonvolatile memory device 1100. Here, the memory system 1000 which stores metadata may include a plurality of metadata block groups 120, each of which may include one or more memory blocks 110.

In an example, the nonvolatile memory device 1100 of the memory system 1000 used as the meta SSD may include first to n-th metadata block groups 120_1 to 120_n. The first metadata block group 120_1 may store metadata, for example, first address mapping data, of a first memory system 1000_1 used as a user SSD, the second metadata block group 120_2 may store metadata, for example, second address mapping data, of a second memory system 1000_2 used as a user SSD, and the n-th metadata block group 120_n may store metadata, for example, n-th address mapping data, of an n-th memory system 1000_n used as a user SSD.

Figure 13:
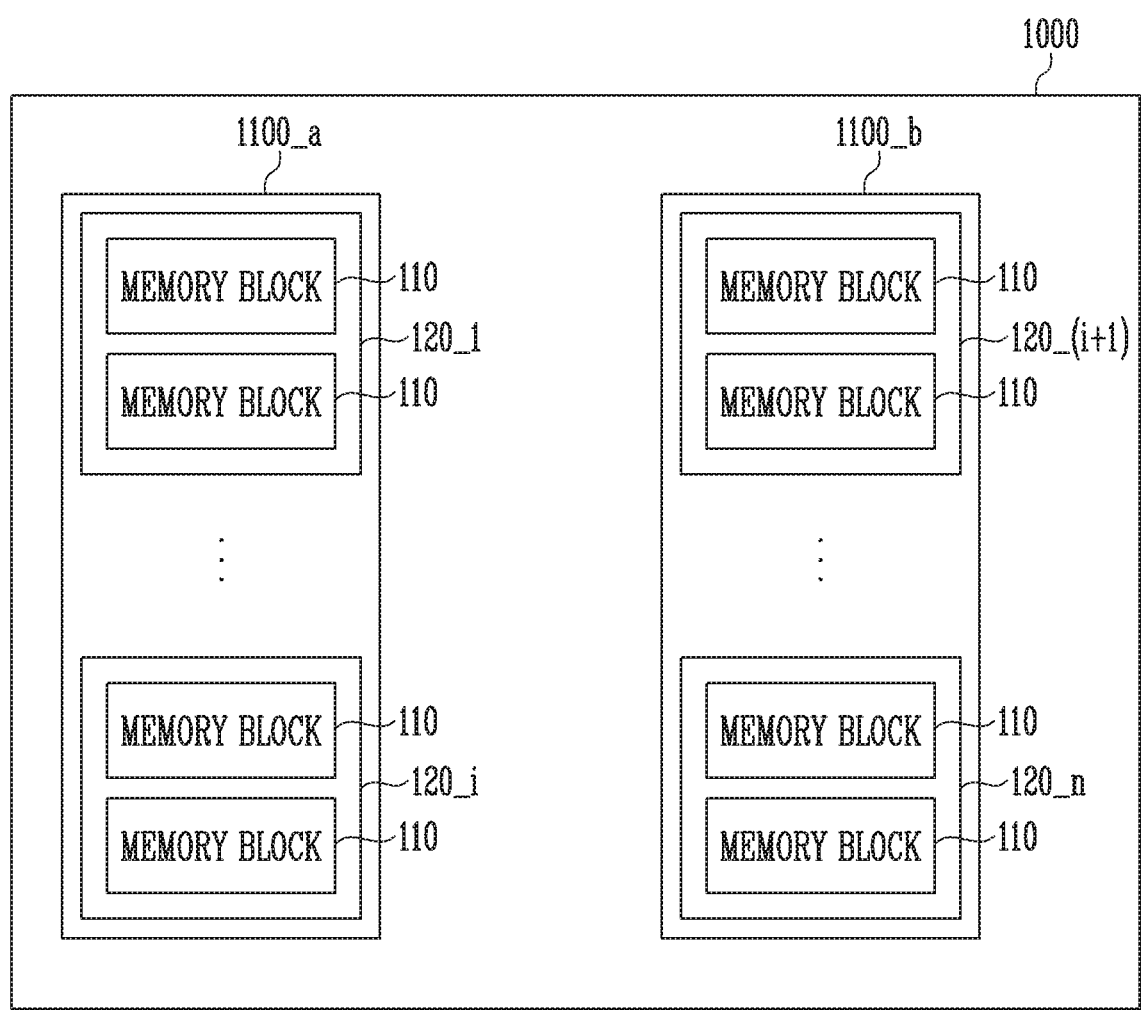
FIG. 13 is a diagram for explaining the configuration of a mapping data storage area according to an embodiment of the present disclosure.

FIG. 13 is a diagram for explaining the configuration of a mapping data storage area according to an embodiment of the present disclosure.

Referring to FIG. 13, a storage system 4000 may use a single memory system 1000 as a meta SSD. The memory system 1000 used as the meta SSD may include a plurality of nonvolatile memory devices 1100. The memory system 1000 used as the meta SSD may divide and separately store pieces of metadata, for example, first to n-th pieces of address mapping data, of first to n-th user SSDs 1000_1 to 1000_n in a plurality of nonvolatile memory devices 1100.

In an embodiment, the memory system 1000 used as the meta SSD may include a-th and b-th nonvolatile memory devices 1100_a and 1100_b. Here, the a-th nonvolatile memory device 1100_a may store pieces of metadata of first to i-th memory systems 1000_1 to 1000_i (where i is a natural number greater than or equal to 2 and less than n), that is, first to i-th pieces of address mapping data, and the b-th nonvolatile memory device 1100_b may store pieces of metadata of (i+1)-th to n-th memory systems 1000_(i+1) to 1000_n, that is, (i+1)-th to n-th pieces of address mapping data.

Each of the a-th and b-th nonvolatile memory devices 1100_a and 1100_b may include a plurality of metadata block groups 120, each of which may include one or more memory blocks 110. In an example, the a-th nonvolatile memory device 1100_a may include first to i-th metadata block groups 120_1 to 120_i, and the first to i-th metadata block groups 120_1 to 120_i may sequentially store first to i-th pieces of address mapping data. Also, the b-th nonvolatile memory device 1100_b may include (i+1)-th to n-th metadata block groups 120_(i+1) to 120_n, and the (i+1)-th to n-th metadata block groups 120_(i+1) to 120_n may sequentially store (i+1)-th to n-th pieces of address mapping data.

Figure 14:
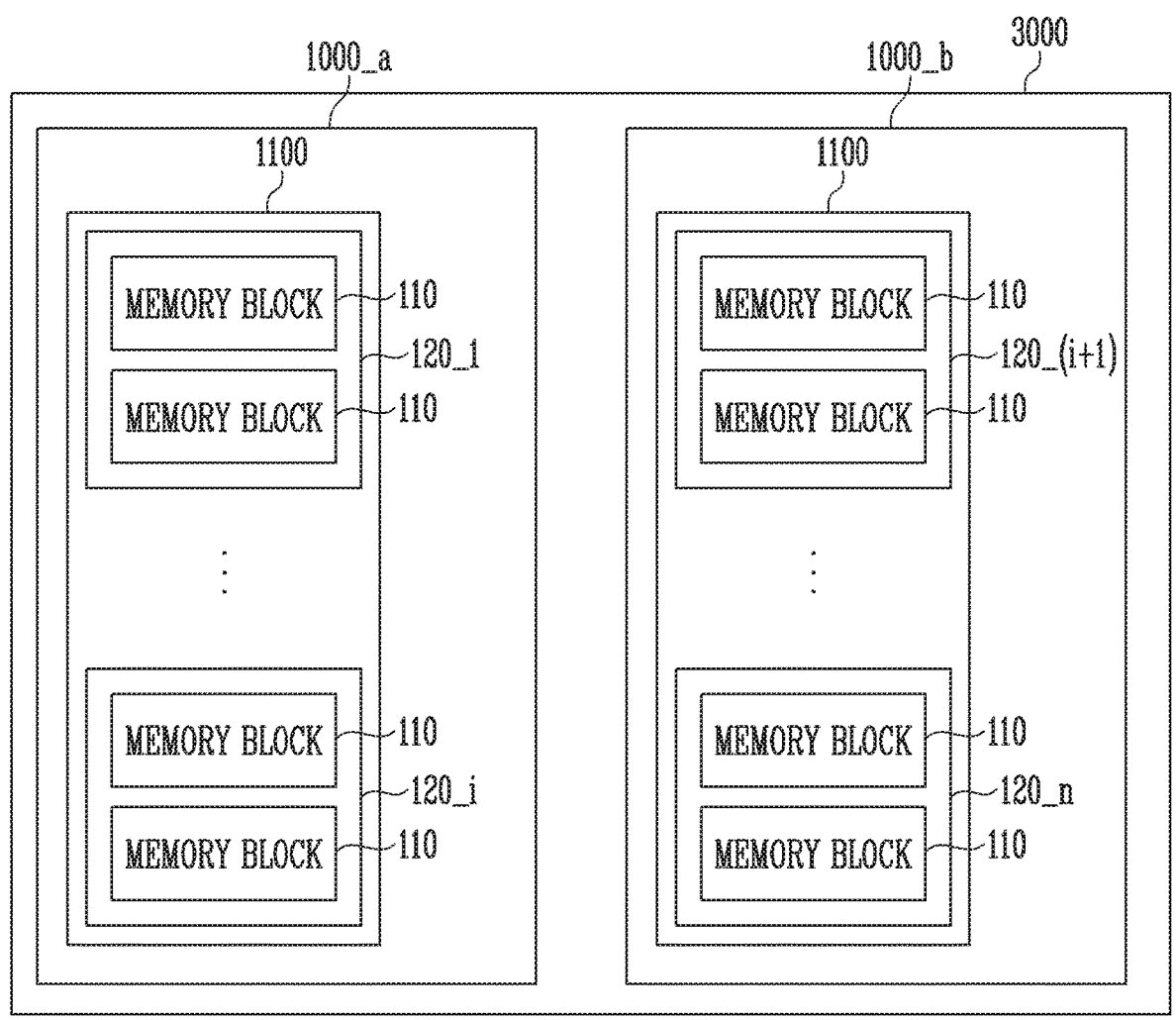
FIG. 14 is a diagram for explaining the configuration of a mapping data storage area according to an embodiment of the present disclosure.

FIG. 14 is a diagram for explaining the configuration of a mapping data storage area according to an embodiment of the present disclosure.

Referring to FIG. 14, a flash array 3000 may include a plurality of memory systems 1000 which store metadata. In an example, the flash array 3000 may include a-th and b-th memory systems 1000_a and 1000_b used as meta-SSDs, and each of the a-th and b-th memory systems 1000_a and 1000_b may include one or more nonvolatile memory devices 1100.

The nonvolatile memory devices 1100 in the a-th and b-th memory systems 1100_a and 1100_b may each include a plurality of metadata block groups 120. Each of the metadata block groups 120 may include one or more memory blocks 110. In an example, the nonvolatile memory device 1100 in the a-th memory system 1000_a may include first to i-th metadata block groups 120_1 to 120_i, and the first to i-th metadata block groups 120_1 to 120_i may sequentially store first to i-th pieces of address mapping data. Also, the nonvolatile memory device 1100 in the b-th memory system 1000_b may include (i+1)-th to n-th metadata block groups 120_(i+1) to 120_n, and the (i+1)-th to n-th metadata block groups 120_(i+1) to 120_n may sequentially store (i+1)-th to n-th pieces of address mapping data.

Figure 15:
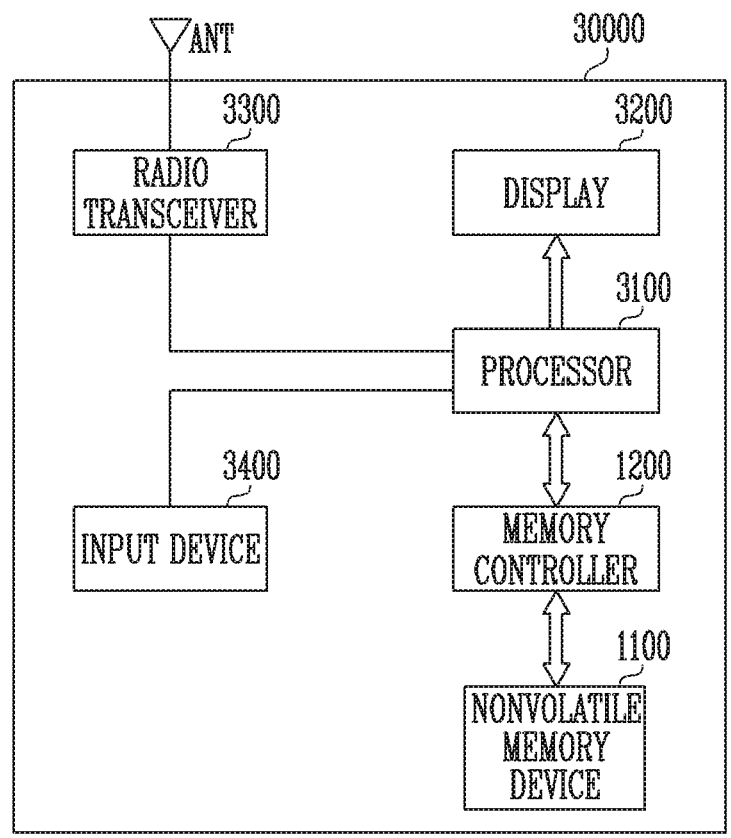
FIG. 15 is a diagram illustrating an embodiment of a memory system.

FIG. 15 is a diagram illustrating an embodiment of a memory system.

Referring to FIG. 15, a memory system 30000 may be embodied in a cellular phone, a smartphone, a tablet PC, a personal digital assistant (PDA) or a wireless communication device. The memory system 30000 may include the nonvolatile memory device 1100 and a memory controller 1200 capable of controlling the operation of the nonvolatile memory device 1100. The memory controller 1200 may control a data access operation, e.g., a program, erase, or read operation, of the nonvolatile memory device 1100 under the control of a processor 3100.

Data programmed in the nonvolatile memory device 1100 may be outputted through a display 3200 under the control of the memory controller 1200.

A radio transceiver 3300 may send and receive radio signals through an antenna ANT. For example, the radio transceiver 3300 may change a radio signal received through the antenna ANT into a signal which may be processed in the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the nonvolatile memory device 1100. Furthermore, the radio transceiver 3300 may change a signal outputted from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data outputted from the memory controller 1200, data outputted from the radio transceiver 3300, or data outputted from the input device 3400 is outputted through the display 3200.

In an embodiment, the memory controller 1200 capable of controlling the operation of the nonvolatile memory device 1100 may be implemented as a part of the processor 3100 or as a chip provided separately from the processor 3100. Further, the memory controller 1200 may be implemented by the exemplary memory controller illustrated in FIG. 2.

Figure 16:
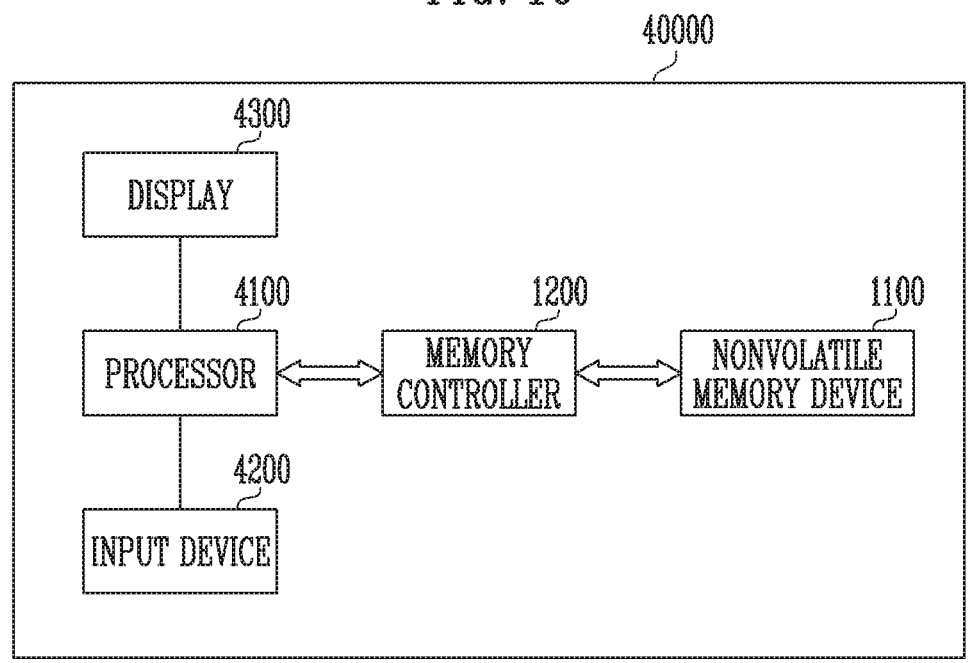
FIG. 16 is a diagram illustrating an embodiment of a memory system.

FIG. 16 is a diagram illustrating an embodiment of a memory system.

Referring to FIG. 16, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the nonvolatile memory device 1100 and a memory controller 1200 capable of controlling the data processing operation of the nonvolatile memory device 1100.

A processor 4100 may output data stored in the nonvolatile memory device 1100 through a display 4300, according to data inputted from an input device 4200. For example, the input device 4200 may be implemented as a point device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the nonvolatile memory device 1100 may be implemented as a part of the processor 4100 or as a chip provided separately from the processor 4100. Further, the memory controller 1200 may be implemented by the exemplary memory controller illustrated in FIG. 2.

Figure 17:
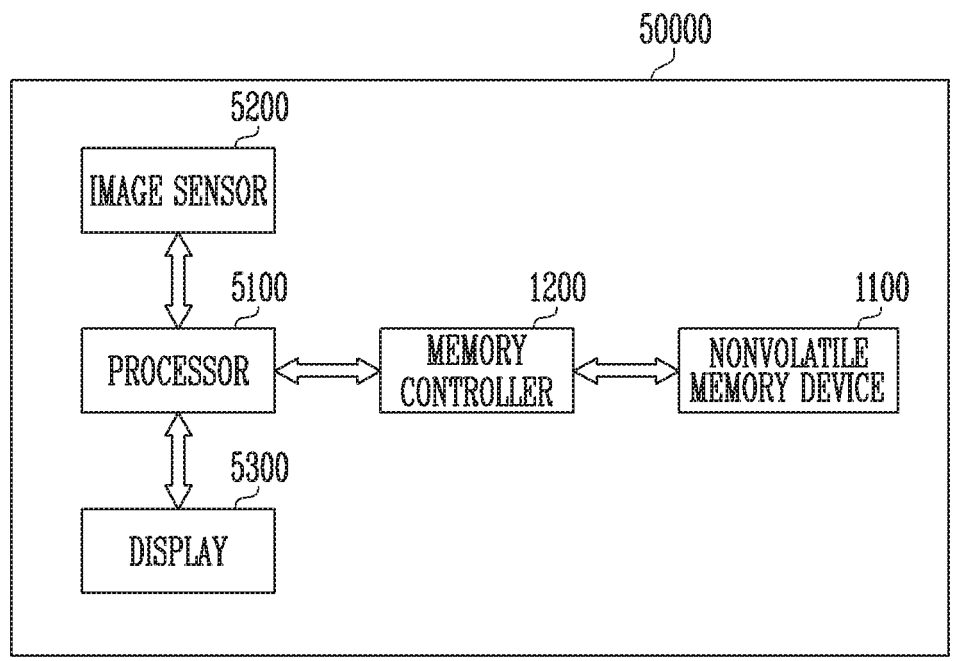
FIG. 17 is a diagram illustrating an embodiment of a memory system.

FIG. 17 is a diagram illustrating an embodiment of a memory system.

Referring to FIG. 17, a memory system 50000 may be embodied in an image processing device, e.g., a digital camera, a portable phone provided with a digital camera, a smartphone provided to with a digital camera, or a tablet PC provided with a digital camera.

The memory system 50000 may include the nonvolatile memory device 1100 and a memory controller 1200 capable of controlling a data processing operation, e.g., a program, erase, or read operation, of the nonvolatile memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be outputted through a display 5300 or stored in the nonvolatile memory device 1100 through the memory controller 1200. Data stored in the nonvolatile memory device 1100 may be outputted through the display 5300 under the control of the processor 5100 or the memory controller 1200.

In an embodiment, the memory controller 1200 capable of controlling the operation of the nonvolatile memory device 1100 may be implemented as a part of the processor 5100, or as a chip provided separately from the processor 5100. Further, the memory controller 1200 may be implemented by the exemplary memory controller illustrated in FIG. 2.

Figure 18:
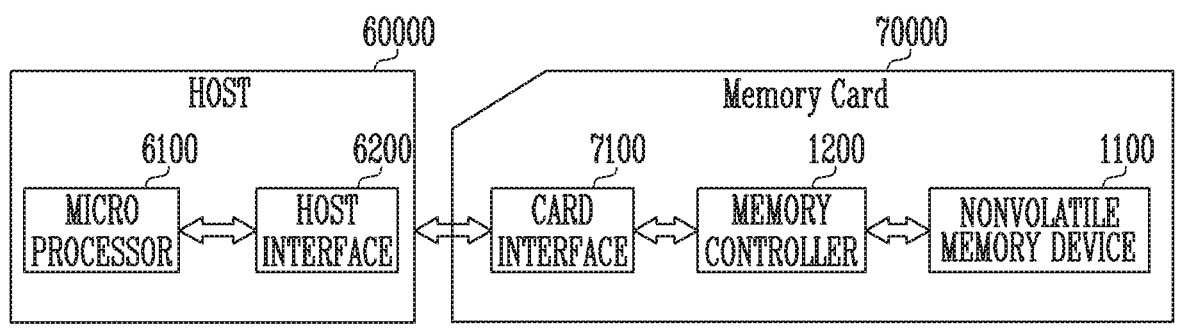
FIG. 18 is a diagram illustrating an embodiment of a memory system.

FIG. 18 is a diagram illustrating an embodiment of a memory system.

Referring to FIG. 18, a memory system 70000 may be embodied in a memory card or a smart card. The memory system 70000 may include the nonvolatile memory device 1100, a memory controller 1200 and a card interface 7100.

The memory controller 1200 may control data exchange between the nonvolatile memory device 1100 and the card interface 7100. In an embodiment, the card interface 7100 may be a secure digital (SD) card interface or a multi-media card (MMC) interface, but it is not limited thereto. Further, the memory controller 1200 may be implemented by the exemplary memory controller illustrated in FIG. 2.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may be hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the nonvolatile memory device 1100 through the card interface 7100 and the memory controller 1200 under the control of a microprocessor 6100.

The present disclosure provides a storage system, which includes a separate meta SSD for storing metadata about a plurality of user SSDs for storing user data and which may efficiently perform a boot operation and a metadata flush operation using the separate meta SSD.

While various embodiments of the present disclosure have been described and illustrated, those skilled in the art will appreciate, in light of the present disclosure, that various modifications, additions and substitutions are possible. Therefore, the scope of the present disclosure is defined by the appended claims and equivalents of the claims rather than by the description preceding them.

What is claimed is:

1. A method of operating a storage system, comprising:
outputting, by a host system, a command for reading address mapping data, pieces of which correspond to first to (n−1)-th memory systems, the address mapping data being stored in a nonvolatile memory device of an n-th memory system, where n is a natural number of 3 or more;
outputting, in a first transmission operation, the address mapping data from the n-th memory system and inputting the address mapping data to the host system in response to the command; and
outputting, in a second transmission operation, the address mapping data from the host system and inputting the address mapping data to respective controller buffer memories of the first to (n−1)-th memory systems,
wherein each of the first to n-th memory systems comprises a controller buffer memory and a nonvolatile memory device.

2. The method according to claim 1, wherein:
the address mapping data include first to (n−1)-th pieces of address mapping data respectively corresponding to the first to (n−1)-th memory systems, and
the first to (n−1)-th pieces of address mapping data are sequentially input to the respective controller buffer memories of the first to (n−1)-th memory systems during the second transmission operation.

3. The method according to claim 2, wherein:
the first to (n−1)-th memory systems are configured to respectively buffer the first to (n−1)-th pieces of address mapping data, input from the host system, in the respective controller buffer memories.

4. The method according to claim 1, wherein:
the host system comprises a host buffer memory,
the address mapping data are buffered in the host buffer memory, and
the second transmission operation comprises accessing, by the first to (n−1)-th memory systems, the host buffer memory and fetching the address mapping data.

5. The method according to claim 3, wherein
during the first transmission operation, the n-th memory system is configured to:
read the address mapping data stored in the nonvolatile memory device of the n-th memory system in response to the command,
buffer the address mapping data, read from the nonvolatile memory device of the n-th memory system, in the controller buffer memory of the n-th memory system, and
output the address mapping data, buffered in the controller buffer memory of the n-th memory system, to the host system.

6. The method according to claim 5, further comprising:
inputting, by the host system, a read command to the first memory system;
reading, by the first memory system, data stored in the nonvolatile memory device of the first memory system based on the first piece of address mapping data buffered in the controller buffer memory of the first memory system, in response to the read command; and
outputting the data to the host system.

7. The method according to claim 3,
the method further comprising:
inputting, by the host system, a write command and a logical address to the first memory system;
mapping, by the first memory system, a physical address to the logical address in response to the write command;
updating the first piece of address mapping data buffered in the controller buffer memory of the first memory system based on mapping between the logical address and the physical address; and
programming write data to the nonvolatile memory device of the first memory system based on the physical address.

8. The method according to claim 3, wherein:
the n-th memory system is configured to store only metadata including the address mapping data, and
the metadata is data internally generated in the storage system.

9. The method according to claim 2, wherein the outputting of the command is performed when the storage system is powered on.

10. A method of operating a storage system, comprising:
reading, by a host system, first address mapping data buffered in a controller buffer memory of a first user Solid State Drive (SSD) when a flush condition for the first address mapping data corresponding to the first user SSD is satisfied in the first user SSD, and second address mapping data corresponding to a second user SSD from a controller buffer memory of the second user SSD;
outputting, by the host system, the first address mapping data read from the controller buffer memory of the first user SSD to a meta SSD; and
flushing, by the meta SSD, the first address mapping data output from the host system to a nonvolatile memory device of the meta SSD.

11. The method according to claim 10, wherein the reading comprises accessing, by the host system, the controller buffer memory of the first user SSD and fetching the first address mapping data.

12. The method according to claim 10, wherein the second user SSD does not satisfy the flush condition.

13. The method according to claim 12, wherein:
the outputting comprises outputting, by the host system, the second address mapping data read from the controller buffer memory of the second user SSD to the meta SSD, and
the flushing comprises flushing, by the meta SSD, the second address mapping data to the nonvolatile memory device of the meta SSD.

14. The method according to claim 10, further comprising:
inputting, by the host system, a write command and a logical address to the first user SSD;
mapping, by the first user SSD, the logical address to a physical address in response to the write command; and
updating, by the first user SSD, the first address mapping data buffered in the controller buffer memory of the first user SSD based on mapping between the logical address and the physical address,
wherein the flush condition is satisfied when an extent of update of the first address mapping data is greater than or equal to a set level.

15. A storage system, comprising:
a flash array including first to n-th user Solid State Drives (SSDs) and a first meta SSD, where n is a natural number of 2 or more; and
a host system coupled to the flash array,
wherein each of the first to n-th user SSDs and the first meta SSD comprises a controller buffer memory and a nonvolatile memory device, and
wherein the nonvolatile memory device of the first meta SSD is configured to store first to n-th pieces of address mapping data respectively corresponding to the first to n-th user SSDs, and
wherein the host system is configured to read the first to n-th pieces of address mapping data stored in the nonvolatile memory device of the first meta SSD during a boot operation, and store the read first to n-th pieces of address mapping data in the respective controller buffer memories of the first to n-th user SSDs.

16. The storage system according to claim 15, wherein:
the host system comprises a host buffer memory, and
the host system is configured to access the controller buffer memories of the first to n-th user SSDs, fetch the first to n-th pieces of address mapping data, buffer the first to n-th pieces of address mapping data in the host buffer memory, and flush the first to n-th pieces of address mapping data, buffered in the host buffer memory, to the first meta SSD.

17. The storage system according to claim 16, wherein the first to n-th user SSDs are configured to respectively update the first to n-th pieces of address mapping data, stored in the respective controller buffer memories, in response to a write command inputted from the host system.

18. The storage system according to claim 17, wherein the first to n-th user SSDs are configured to respectively perform write operations on the respective nonvolatile memory devices based on the respective updated first to n-th pieces of address mapping data.

19. The storage system according to claim 16, wherein the first to n-th pieces of address mapping data are stored in different memory blocks in the nonvolatile memory device of the first meta SSD.

20. The storage system according to claim 16, wherein:
the flash array further comprises a second meta SSD, and
the first to n-th pieces of address mapping data are divided into two groups, a first group of which is stored in the first meta SSD and a second group of which is stored in the second meta SSD.

* * * * *